United States Patent
Slocum et al.

[11] Patent Number: 6,024,526
[45] Date of Patent: *Feb. 15, 2000

[54] INTEGRATED PROBER, HANDLER AND TESTER FOR SEMICONDUCTOR COMPONENTS

[75] Inventors: Alexander H. Slocum, Bow, N.H.; Luis A. Muller, Cambridge, Mass.

[73] Assignee: Aesop, Inc., Concord, N.H.

[*] Notice: This patent issued on a continued prosecution application filed under 37 CFR 1.53(d), and is subject to the twenty year patent term provisions of 35 U.S.C. 154(a)(2).

[21] Appl. No.: 08/546,236

[22] Filed: Oct. 20, 1995

[51] Int. Cl.⁷ ............................................. B25J 15/06
[52] U.S. Cl. ........................................ 414/226.01; 901/40
[58] Field of Search ........................... 414/222, 225, 414/226, 403, 729, 736, 737, 222.01, 225.01, 226.01; 901/28, 29, 47, 8, 16, 40; 294/64.1, 65; 29/832, 833, 834, 740

[56] References Cited

U.S. PATENT DOCUMENTS

| | | | |
|---|---|---|---|
| 3,451,224 | 6/1969 | Colechia et al. | 901/8 X |
| 3,584,741 | 6/1971 | Schirmer | 209/74 |
| 3,910,621 | 10/1975 | Hillier | 294/64.1 |
| 3,973,795 | 8/1976 | Goransson | 294/65 |
| 4,571,149 | 2/1986 | Soroka et al. | 414/750 |
| 4,648,786 | 3/1987 | Sakurai | 901/40 X |
| 4,654,955 | 4/1987 | Mathie | 414/226 X |
| 4,675,993 | 6/1987 | Harada | 29/740 |
| 4,715,591 | 12/1987 | Sato et al. | 209/573 |
| 4,760,924 | 8/1988 | Sato et al. | 209/573 |
| 4,926,118 | 5/1990 | O'Conner et al. | 324/158 |
| 4,936,329 | 6/1990 | Michael et al. | 414/225 X |
| 5,052,736 | 10/1991 | Loncaric et al. | 294/106 |
| 5,114,300 | 5/1992 | Shahinpoor et al. | 901/29 X |
| 5,129,279 | 7/1992 | Rennex | 901/15 X |
| 5,131,535 | 7/1992 | O'Conner et al. | 206/329 |
| 5,161,936 | 11/1992 | Kato | 901/8 X |
| 5,168,218 | 12/1992 | Rich | 324/158 |
| 5,177,434 | 1/1993 | Suzuki et al. | 324/158 |
| 5,180,974 | 1/1993 | Mitchell et al. | 324/158 |
| 5,284,413 | 2/1994 | Wilkinson et al. | 294/65 X |
| 5,290,134 | 3/1994 | Baba | 414/404 |
| 5,307,011 | 4/1994 | Tani | 324/158 |
| 5,350,269 | 9/1994 | Azuma et al. | 901/47 X |
| 5,384,531 | 1/1995 | Yamazaki et al. | 324/765 |
| 5,451,134 | 9/1995 | Bryfogle | 414/680 |
| 5,544,421 | 8/1996 | Thompson | 414/222 |

FOREIGN PATENT DOCUMENTS

| | | | |
|---|---|---|---|
| 0 712 269 | 5/1996 | European Pat. Off. | H05K 13/08 |
| 0 749 002 | 12/1996 | European Pat. Off. | G01D 5/241 |
| 2 543 186 | 9/1984 | France | E02B 3/14 |
| 41 17 538 | 7/1992 | Germany | G02B 23/16 |
| 63-56927 | 8/1986 | Japan | H01L 21/66 |
| 92/17313 | 10/1992 | WIPO | B23Q 1/14 |
| 94/29946 | 12/1994 | WIPO | H02N 2/10 |

OTHER PUBLICATIONS

Tegal Advertisement, *Electronics News*, Sep. 25, 1995.
Geodetics Brochure, undated.

*Primary Examiner*—Donald W. Underwood
*Attorney, Agent, or Firm*—Edmund J. Walsh

[57] ABSTRACT

An integral unit for use in testing semiconductor components. The unit is designed to manipulate either packaged semiconductor components or semiconductor wafers and present them to a test head. It provides significant space savings because it replaces the need for separate prober, handler and tester units. The integrated unit includes a positioning mechanism with a tool plate that can be changed to grasp either a semiconductor wafer or a tray of semiconductor components. The tool plate uses a vacuum plate. To hold a tray of semiconductor parts, the vacuum plate has numerous independently operable holes. Each hole is positioned behind one semiconductor component and can be engaged or released separately so that the components can be sorted into separate output bins. To hold a wafer, the tool plate has an extendible tongue member that can be inserted into a stack of semiconductor wafers to pick up one wafer in the stack. One disclosed positioning mechanism is a hexapod unit, which, due to its light weight, allows fast and accurate positioning of the semiconductor devices. Multiple positioning mechanisms are used in some instances to increase throughput.

29 Claims, 15 Drawing Sheets

INTEGRATED PROBER, HANDLER AND TESTER FOR SEMICONDUCTOR COMPONENTS

This invention relates generally to manipulating small objects and more specifically to handling semiconductor components during their manufacture.

There are a great many applications for testing or doing finish operations on small parts. A big concern in many instances is how to feed and hold the parts without jamming. The problem is particularly accute in the semiconductor industry because semiconductor components are very small but undergo many processing steps.

Packaged semiconductor components are typically fed to processing devices by a device called a "handler." U.S. Pat. Nos. 4,715,501 and 4,760,924 to Sato et al. illustrate tube type handlers. In these handlers, the semiconductor components generally slide along rails to a work site, where processing is performed. At one such work site, the semiconductor component is tested. For testing the parts are held in a position where they make electrical contact to automated test equipment (called generally a "tester"). After the parts are tested, they slide down other rails and are placed back into tubes.

The rails following the test site are configured based on the result of the test so that the tube into which a tested component is inserted is selected based on the results of the test. The components are sorted so that, at a minimum, functioning components are inserted into different tubes than nonfunctioning components. In some applications, the testing reveals that certain components function, but only at some reduced operating level. For example, a semiconductor component may only operate at a reduced clock rate or a memory might only operate for a range of addresses. Therefore, the results of testing might be used to sort the components into different grades, with each grade being routed to a different tube.

Tube type handlers tend to jamb more often than desired. Jamming is very undesirable because it interrupts the processing of the components while the jamb is cleared. In the manufacturing operation for semiconductors, the equipment used to test the semiconductor components (called generally a "tester") is relatively expensive. To make the manufacturing operation efficient, the tester should be in operation as much as possible.

Robotic manipulators are sometimes used to move individual semiconductor components to a test site and then place the tested part in an appropriate output bin. An example of a robotic manipulator is shown in Japanese patent 63-56927. That manipulator includes a vision system for determining whether the semiconductor component is properly grasped by the robotic manipulator.

Robotic manipulators are less subject to jamming than tube type handlers. However, robotic manipulators tend to be relatively slow. To be able to accurately position a semiconductor component in the test site, the robotic manipulator must have several degrees of freedom. Each degree of freedom requires a jointed structure and a drive mechanism. The multiple joints and drive mechanisms are typically arranged in a sequential order, which results in a structure with relatively high inertia. A jointed robotic manipulator has a relatively low natural frequency. The combination of high inertia and low natural frequency leads to the requirement that the robotic manipulator must move relatively slowly to position components accurately. Slow speed is undesirable because it results in inefficient usage of the tester.

Tray type handlers have also been made. In a tray type handler, multiple components are loaded into a tray at one time. Tray type handlers are predominately used when multiple components, such as memory chips, are tested simultaneously. Examples of tray type handlers are shown in U.S. Pat. No. 5,177,434 to Suzuki et al., U.S. Pat. No. 5,180,974 to Mitchell et al., U.S. Pat. No. 5,168,218 to Rich, U.S. Pat. No. 5,384,531 to Yamazaki et al., U.S. Pat. Nos. 4,926,118 and 5,131,535 to O'Conner et al., U.S. Pat. No. 5,227,717 to Tsurishima et al., U.S. Pat. No. 5,290,134 to Baba, U.S. Pat. No. 5,307,011 to Tani and U.S. Pat. No. 5,313,156 to Klug et al.

Tray type handlers are less prone to jamming. However, to test multiple parts simultaneously, the components must be loaded into trays which hold the components with the same spacing (pitch) as the test sites. Elements are sometimes included in the handler to load the trays into appropriate sized trays. After the test, the components must be unloaded into trays based on the results of the test. These loading and unloading operations are often performed with one or more "pick and place" units. A "pick and place" is a vacuum actuated device which can pick up a component, move it about in a plane and then set it down. These devices have three degrees of motion and generally a limited range of travel. They are therefore less complicated than a full robotic manipulator. Nonetheless, they reduce the speed of operation, increase the complexity of the handler and occupy space.

Some prior art tray type handlers have increased their operating speed by performing loading and unloading operations in parallel. Speed is also increased by buffering trays for the loading and unloading operations so that as soon as one tray is loaded or unloaded, another tray is ready to for loading or unloading. However, these measures further increase the size and complexity of the handler. Size is a disadvantage, particularly in the manufacture of semiconductors. Semiconductors are manufactured in a "clean room." Building and maintaining a clean room is relatively expensive, with the cost increasing in relation to the size. Having processing equipment as small as possible reduces the need for clean room space and decreases the overall cost of the manufacturing operation.

It would be highly desirable to have a simple, compact and fast device for handling packaged semiconductor components for testing.

Furthermore, during manufacture, semiconductor components are often tested before they are packaged. The components are tested while still on a silicon wafer. The wafer contains numerous dies, each one of which can be made into one component.

The wafer is loaded into a device called a "prober." The prober moves the wafer around to position one of the dies at a test site on a tester. Generally, the tester is of the same type as is used to test a packed component, but the test site is shaped differently to interface to a die on a wafer rather than a packaged part.

The bulk of a prober is typically a large heavy linear motion system stage that has to move in X, Y, and Z to center the dies and then move them up against the testing device. Rotational motion might also be required to properly align the wafer with the tester. Optical inspection systems are sometimes used to determine the orientation of the wafer in the prober so that position of the wafer can be properly adjusted.

Probers traditionally use stacked carriages, with each carriage moving in one direction. Each carriage might weigh on the order of 100 pounds (45 kg). The combined weight of the carriages can be substantial, and, as discussed above making accurate positioning at high speeds difficult.

In addition, robotic means are needed to load the parts or wafers onto the stage. The result is a complex and expensive system.

It would be preferable to have a less complex and less expensive system. It would also be desirable to have a smaller test system. It would also be desirable to have a single device which could position wafers and packaged chips with relatively minor modifications. It is also desirable to have a positioning device that could position semiconductor components quickly and accurately and also to sort them with relatively few components.

SUMMARY OF THE INVENTION

With the foregoing background in mind, it is an object of the invention to provide a single mechanism to pick up either a semiconductor wafer or a tray of packaged parts.

It is also an object to provide a smaller test system.

It is also an object to provide a device to position semiconductor components quickly and accurately.

It is a further object to provide a less complex and less expensive system.

The foregoing and other objects are achieved in a system having a positioning with multiple degrees of freedom. The positioning mechanism is located near both a receiving station and a work site. Multiple objects in the receiving station are picked up and transported to the work site, where each object is operated on in turn.

In one embodiment, the multiple objects are semiconductor components. The positioning mechanism is adapted to hold multiple packaged semiconductor components in a tray or a wafer containing multiple semiconductor components in die format.

In one embodiment, the positioning mechanism is one or more hexapods.

In one embodiment, the positioning mechanism includes a plurality of independently controllable vacuum ports, allowing a single wafer to be picked up or a plurality of components on a tray to be picked up simultaneously but put down in separate places.

In a further embodiment, the positioning mechanism is controlled to pick up a tray of separate components, hold the tray at a compound angle and shake the tray to position the components in a predetermined location.

In yet a further embodiments, the work site is part of a semiconductor tester which is integrated with the positioning mechanism.

In yet a further embodiment, the positioning mechanism includes components to simultaneously grasp multiple groups of objects in conjunction with a optical system for determining the positions of the grasped objects. One group of components is presented to the work site while another group is presented to the optical system.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
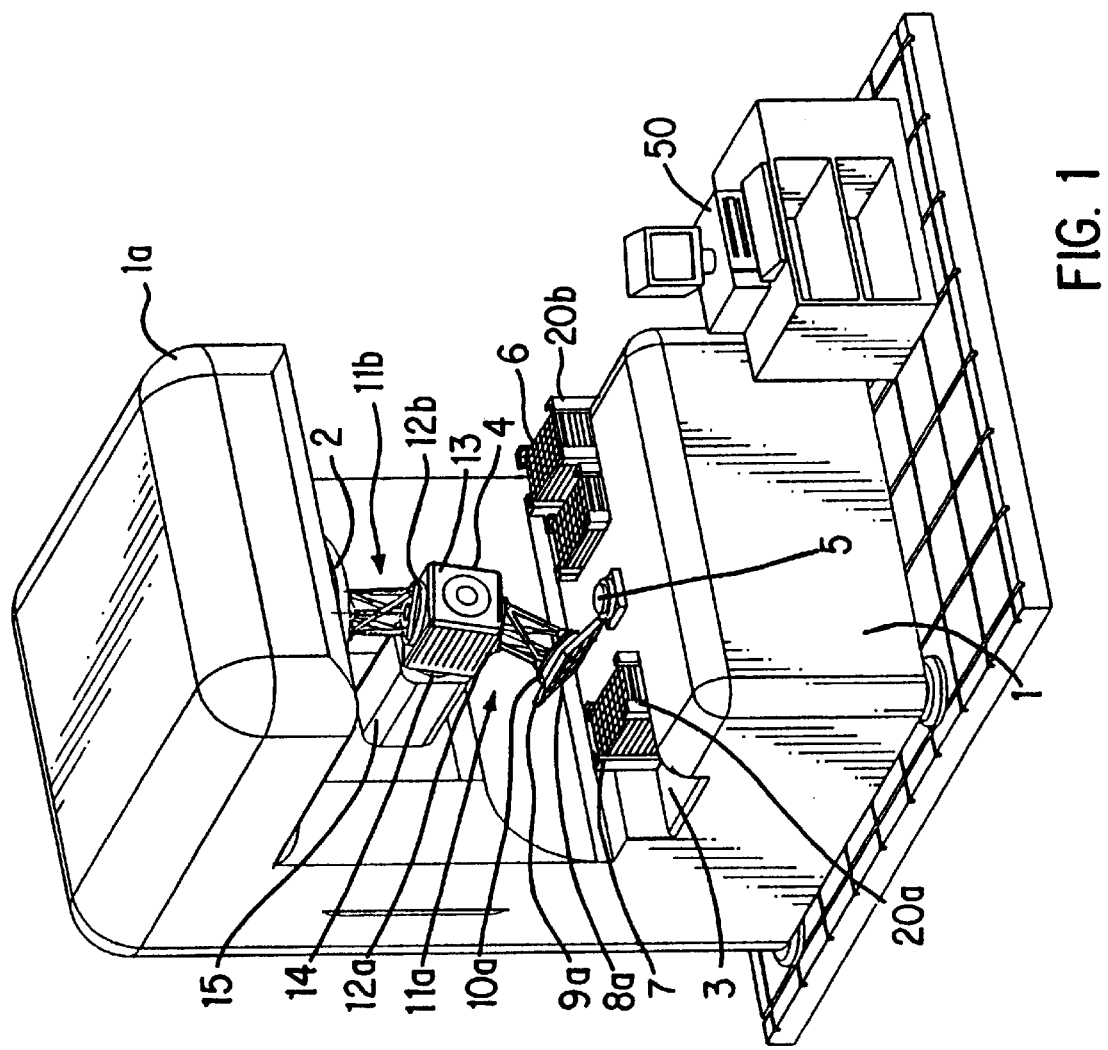
FIG. 1 shows an isometric view of a system configured with two hexapods that are picking up and visually mapping the location of chips in a tray, and holding chips in a tray up to a testing surface respectively.

FIG. 1 shows a machine 1 with an upper part 1a that contains a work site 2. Objects to be presented to work site 2 are placed in loading zone 3. Positioning mechanisms 11a and 11b pick up objects from the loading zone 3 and present them to the work site 2, where the objects are processed. The positioning mechanisms 11a and 11b then place the objects in output zone 4.

Figure 2:
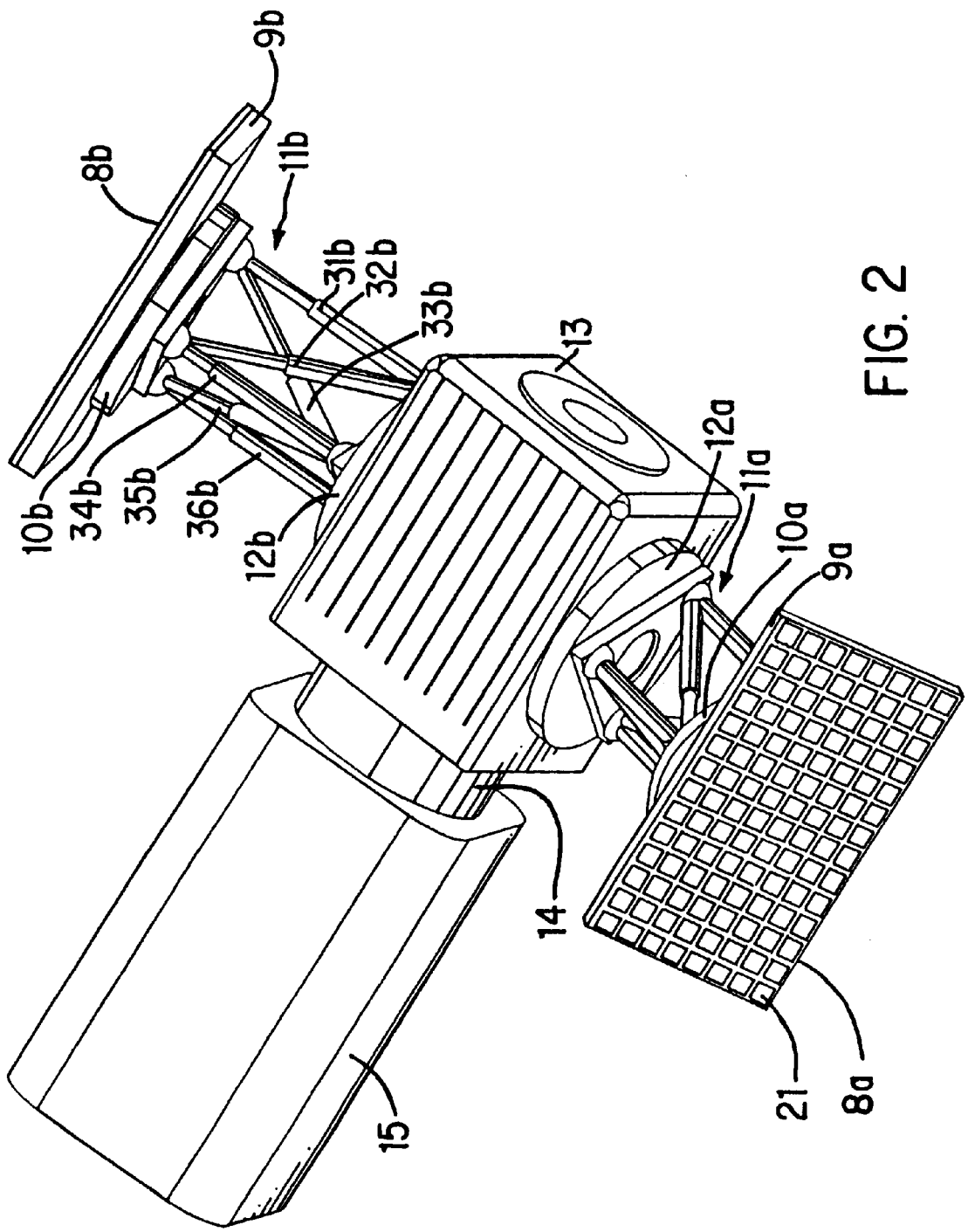
FIG. 2 shows a close-up isometric view of the Hexapod that has picked up and is holding a tray of chips to be tested.
Figure 3:
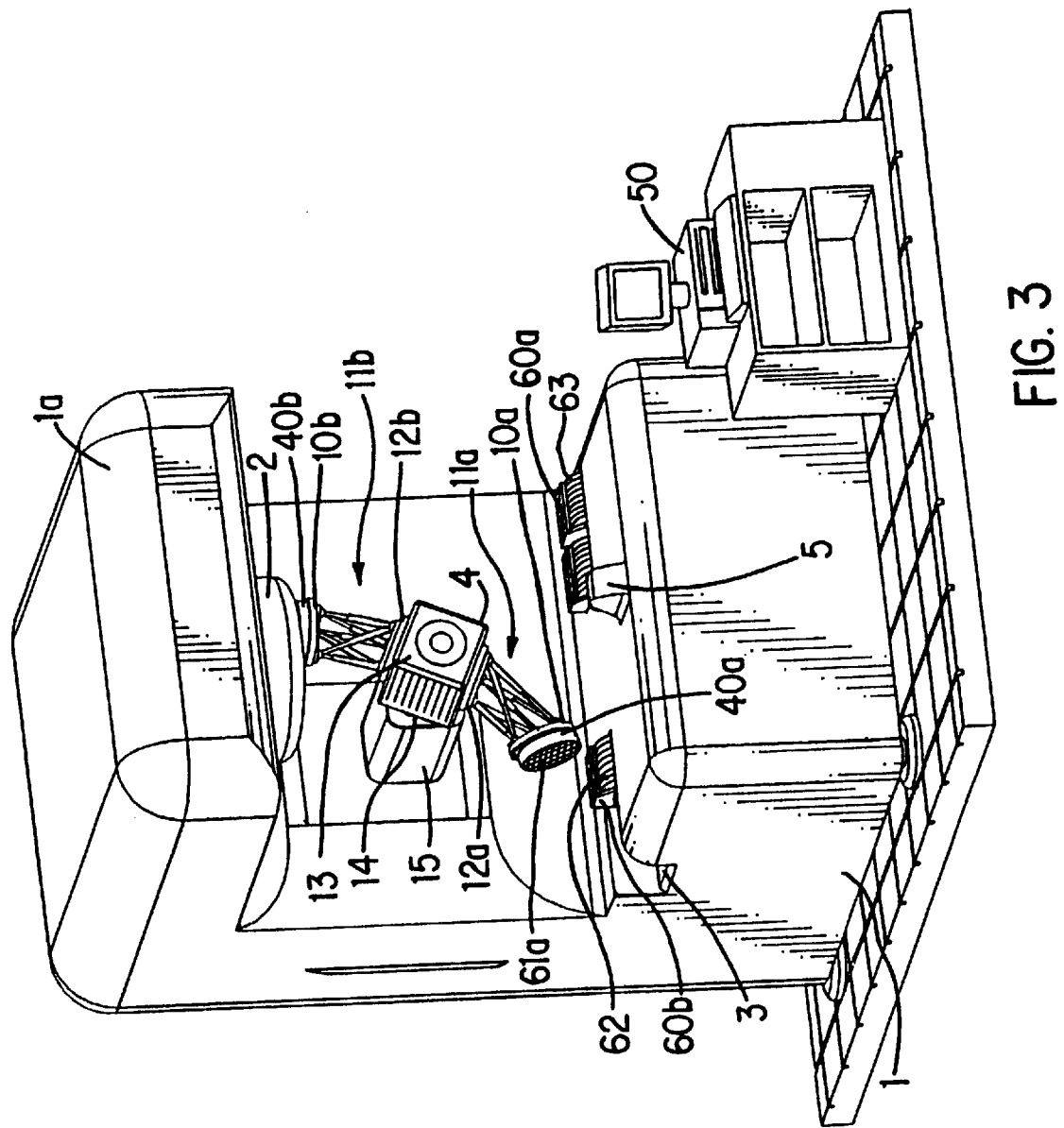
FIG. 3 is an isometric view of a system configured with two hexapods that are picking up and visually mapping the location of integrated circuit wafers, and testing die sites on the wafers respectively.

In the preferred embodiment, the objects are semiconductor components. FIGS. 1 and 2 show, for example that the objects are packaged semiconductor components in a tray 8a. FIG. 3 shows that the objects are dies (not shown) on a semiconductor wafer 61a.

Also in the preferred embodiment, work station 2 is a test site as typically found on the test head of a tester. Such test sites are well known in the art. The electronic circuitry needed, as known in the art, to implement a tester is incorporated into machine 1, but is not explicitly shown.

Work station 2 could alternatively be a different device for enhancing the quality of a product, such as a pin straightener, an epoxy dispenser or other such system typically used in the preparation of semiconductor chips.

The number of objects simultaneously processed at work site 2 and the number of objects simultaneously picked up by positioning mechanism 11a or 11b is not critical to the invention. It is contemplated, though, that the number of objects simultaneously processed at work site 2 will be much lower than the number of objects simultaneously picked up by positioning mechanisms 11a or 11b. In such a situation, each positioning mechanism 11a and 11b indexes the objects it has picked up so that only a portion of them are presented to work station 2 at one time.

In the embodiment of FIG. 1, positioning mechanisms 11a and 11b are hexapods or Stewart platforms. A hexapod is essentially a parallel type robot where a platform is joined to a base by six servo controlled actuators ("struts"). The struts can rotate about the points where they are mounted to the platform and the base. The length of the struts is independently adjustable, allowing the platform to be moved with six degrees of freedom.

Using a hexapod in the invention provides the advantage of allowing a wide range of motions from a relatively small system with low inertia. Fast and accurate positioning of semiconductor devices or other objects is therefore possible.

Positioning mechanisms 11a and 11b are shown in greater detail in FIG. 2. Positioning mechanisms 11a and 11b are attached to opposite sides of base 13. Base 13 is in turn attached to support 15 via rotary joint 14. Support 15 is mounted between work site 2 and loading and unloading zones 3 and 4, respectively.

This arrangement allows one of the positioning mechanisms 11a or 11b to be presenting objects to work site 2 while the other positioning mechanism is placing objects in unloading zone 4 and picking up objects from loading zone 3. For example, FIG. 1 shows positioning mechanism 11b presenting objects to work site 2 while positioning mechanism 11a is picking up objects from loading zone 3. Once the objects held by one of the positioning mechanism are processed at work site 2, base 13 can be rotated 180° so that objects held in the other positioning mechanism can be immediately processed.

FIG. 2 shows that each positioning mechanism 11a and 11b is mounted to base 13 with rotary mounts 12a and 12b, respectively. Though hexapods are capable of imparting rotary motion, the range of motion is limited by the amount the struts of the hexapod can extend and retract. Rotary mounts 12a and 12b are optional and are only required in situations in which greater rotary motion is required than can be provided by the positioning mechanisms 11a and 11b.

Each hexapod has six struts, with struts 31a, 32b, 33b, 34b, 35b and 36b for positioning device 11b being numbered. Two sets of six struts are attached to platforms 10a and 10b, respectively. The positions of platforms 10a and 10b can be changed by changing the length of the struts attached to each platform. Further details of the construction of each hexapod are given in conjunction with FIGS. 13 and 14, below.

Attached to each of the platforms 10a and 10b are tool plates 9a and 9b. Tool plates 9a and 9b hold the objects to be processed at work site 2. In a preferred embodiment, tool plates 9a and 9b are porous vacuum plates. Objects are grasped on the tool plates by drawing a vacuum through the porous plates. Objects are released from the tool plate by releasing the vacuum. Tool plates 9a and 9b could, however, be any mechanism to grasp objects, such as mechanical pincers, or magnetic pick ups.

In the embodiment of FIGS. 1 and 2, the objects to be grasped are packaged semiconductor chips 21 held in trays 8a and 8b, which are held to tool plates 9a or 9b. In some instances, it will be necessary to change the tool plates 9a and 9b such that different types of objects can be picked up. For that reason, the tool plates 9a and 9b are preferably separate from platforms 10a and 10b so that they might be easily changed.

Figure 6:
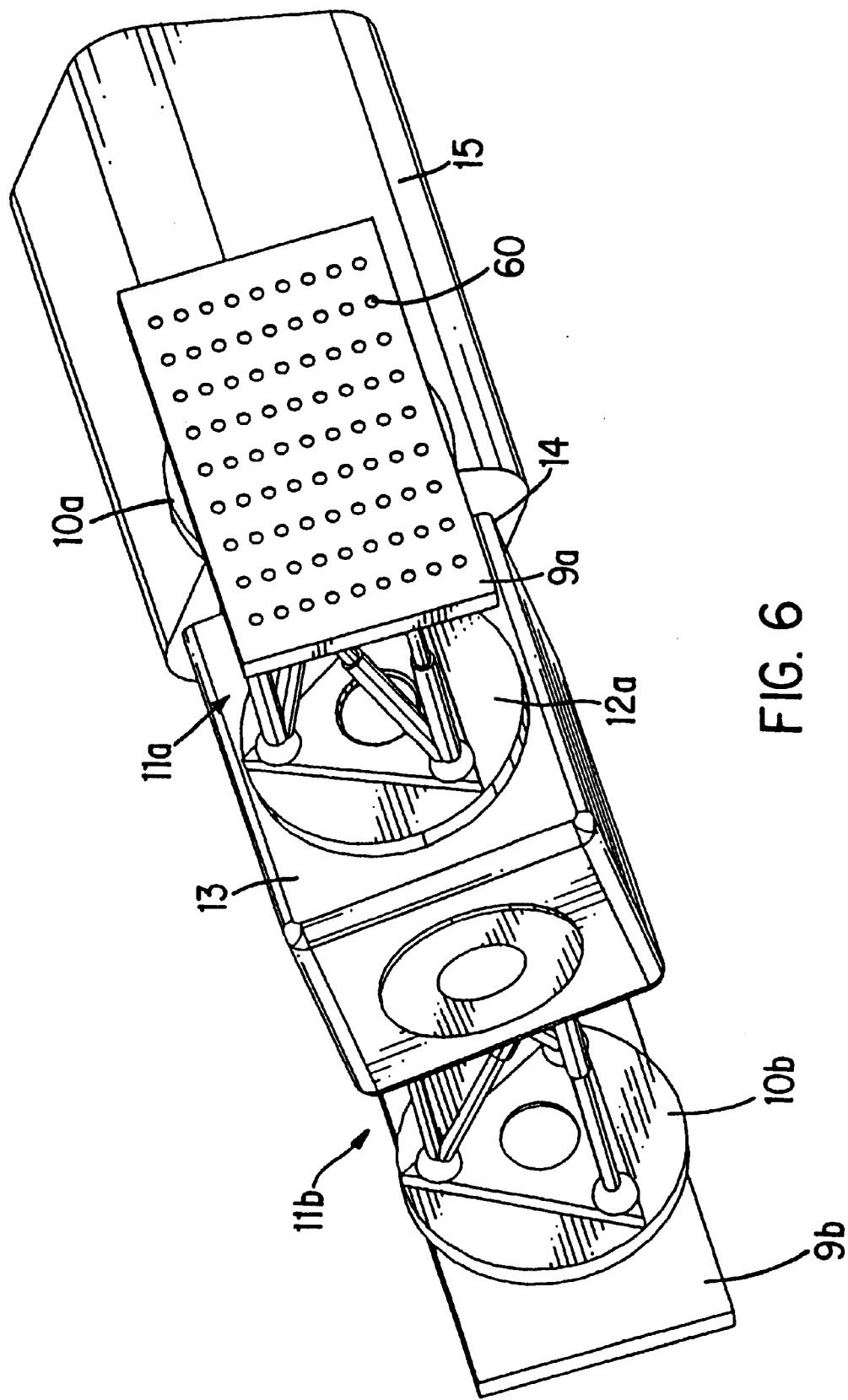
FIG. 6 shows a vacuum end effector plate with an array of vacuum holes that are individually electronically controlled so chips can be picked up and then dropped off one-by-one into sorting bins after they have been tested.

FIG. 6 shows an embodiment of tool plates 9a and 9b which contain holes 60 in a regular array rather than a porous plate. Holes 60 are placed so that one of the holes 60 will align with each of the semiconductor chips 21 (FIG. 2) and others of the holes will align with other parts of the trays 8a and 8b. Each of the holes 60 can be connected to a vacuum feed (not shown) such that the vacuum at each hole can be separately controlled.

For use with the embodiment of FIG. 6, each tray 8a and 8b (FIG. 2) has recesses (not numbered), each holding one of the semiconductor chips 21 (FIG. 2). The trays are open at the bottoms of the recesses (not numbered) so that when a vacuum is drawn through the holes 60 aligned with the semiconductor chips 21 those chips are held in the trays 8a and 8b by the vacuum. However, if a tray 8a or 8b (FIG. 2) is turned upside down and the vacuum released in the holes 60 aligned with the chips 21, the chips 21 will fall out of the tray. Because the vacuum in holes 60 can be independently controlled, one or some of the chips 21 might be released at a time. In this way chips 21 can be selectively released from the trays 8a and 8b (FIG. 2) to allow sorting of chips.

Returning now to FIG. 1, computer 50 is connected to machine 1 through a control interface as is known in the art. Machine 1 contains electro-mechanical devices (not shown) which can move the components shown. The electro-mechanical devices are those conventionally used in the art and are not shown. For example, solenoids, motors, stepper motors, hydraulic actuators and actuators powered by compressed air are all commonly used in semiconductor processing equipment. Control of these devices by computer, such as computer 50, is also well known.

Computer 50 can be a work station, such as a SUN SPARC® computer. However, the type of computer is not important to the invention. For example, a processor embedded in machine 1 might also be used or might be used instead. Any computer capable of executing the control processes described below is suitable.

In use, trays 8a of untested semiconductor components are placed in loading zone 3. In the embodiment of FIG. 1, a plurality of trays 8a are placed in a magazine 20a in loading zone 3. A magazine 20a might be placed in loading zone 3 by a human. Alternatively, semiconductor devices are often moved through processing facilities by mechanized devices, such as robotic carts. Any mechanism for placing magazine 20a in loading zone 3 can be used. In general, once all the trays have been removed from magazine 20a, it will be replaced by another magazine of trays.

Magazine 20a is an indexing type magazine. As one of the trays 8a is taken from the top of the magazine, magazine 20a indexes the trays. It moves all of the trays 8a up one step so that the next tray 8a is at the top and may be accessed. FIG. 1 shows positioning mechanism 11a removing the top tray from magazine 20a.

In the preferred embodiment, magazine 20a will not be precisely positioned relative to positioning mechanism 11a. Therefore, when a tray is picked up, the exact position of the components 21 (FIG. 2) relative to the positioning mechanism 11a will not be known. To determine this orientation, positioning mechanism 11a first moves the tray above camera 5.

Camera 5 is any known type of camera customarily used for optical inspection. Its position relative to base 13 is preferably precisely defined, either by exact placement or by calibration. The position can be precisely defined through high accuracy manufacturing techniques. In a preferred embodiment, though, a calibration routine is run. During calibration, the camera 5 is focused on features of base 13 or positioning mechanism 11a or 11b. The image of these features is used to compute the relative position of positioning mechanism 11a and 11b and camera 5.

Camera 5 produces an image of the tray 8a and the chips 21 (FIG. 2) in the tray. Camera 5 is connected to computer 50 so that this image may be processed by computer 50. Computer 50 uses the image to determine the locations of the chips 21 relative to positioning mechanism 11a. Such computer processing is known in the art and is used, for example in some prober systems.

Once the relative position of the chips 21 held by positioning device 11a is determined, base 13 is rotated so that positioning mechanism 11a faces work station 2. Positioning mechanism 11a is then moved by commands from computer 50 to present each of the chips 21 in tray 8a to work station 2. Machine 1 sends control signals to computer 50 over the computer interface (not shown) when testing of each chip 21 is completed. The control signals also indicate the grade of the device assigned as a result of the test.

Once the testing is completed, base 13 is again rotated. After the rotation, positioning mechanism 11a again faces down. In this position, it can access unloading zone 4.

Unloading zone 4 is shown to contain 2 magazines 20b, which are also indexing magazines. In contrast to magazine 20a, magazines 20b are indexed downward. As a tray is added to the top of one of the magazines 20b, all of the trays in the magazine are moved downwards to make room for the next tray.

FIG. 1 shows two magazines 20b, allowing the chips 21 (FIG. 2) to be sorted into two groups. Positioning mechanism 11a moves the tray 8a above one of the magazines 20b in unloading zone 4. It then aligns one of the chips 21 in the tray it is holding with an empty recess (not numbered) in the top tray in the magazine. The vacuum for that chip is released, and the chip falls into the tray.

Positioning mechanism 11a then moves the tray it is holding to align another chip with the next empty recess in the tray in the magazine 20b. That chip is also dropped into the tray. The process repeats until all chips which should be grouped with the chips in the fist one of the magazines 20b are unloaded. Positioning mechanism 11a then moves the tray it is holding above the next one of the magazines 20b. The process of unloading chips is repeated.

FIG. 1 does not show a magazine for holding empty trays. However, buffer magazines or buffer stations for holding trays are well known in devices which process parts in trays. Once a tray is unloaded, positioning mechanism 11a places the empty tray in the empty tray magazine (not shown).

In one embodiment, multiple empty tray magazines (not shown) are used. There is one empty tray magazine next to each magazine 20b in unloading zone 4. As the top tray in a magazine 20b becomes filled, that magazine 20b is indexed downwards, and an empty tray from the empty tray magazine (not shown) is slid onto the top of the magazine 20b. Of course, many other ways for handling empty trays are possible. For example, empty trays might be collected at a central empty tray magazine and moved by a separate mechanical arm to the top of each magazine 20b as needed. Alternatively, one of the positioning mechanisms 11a or 11b might be used to move empty trays when needed.

A great advantage of this system is its flexibility which is illustrated by the configuration shown in FIG. 3. In FIG. 3, the same basic system of FIG. 1 for testing trays 8a of chips is now used for testing wafers 62. An input cassette 60b of wafers 62 is located in loading zone 3 of machine 1. The output cassette 60a and wafers tested such as 63 are located in unloading zone 4. Once again, positioning mechanism 11a, after completing a test cycle, puts down its part-load and then retrieves a new part-load, in this case another wafer such as 61a, from the input staging area 3. Positioning mechanism 11a then holds wafer 61a in front of the vision system 5 to map the location of specific dies (not shown) on the wafer 61a onto tool plate 40a. In the embodiment of FIG. 3, tool plate 40a is adapted to grip a wafer and could be a porous vacuum plate similar to that used to make tool plate 9a.

Again, positioning mechanism 11a, and its same-configured partner 11b with its respective corresponding components, has the same principal components for this wafer test operation as the chip-test operation shown in FIG. 1. There is a rotary mount 12a that is attached to the base 13. Base 13 is connected via rotatable joint 14 to structure 15 of machine 1. The base platform 12b is connected by servo controlled extendible struts 31a, 32b, 33b, 34b, 35b, 36b shown in FIG. 2, to the end structure 10b. The end structure 10b has a wafer gripper structure 40b attached to it which has modularly replaced the chip end effector 9b. The gripper 40b has vacuum gripped a wafer.

Figure 4:
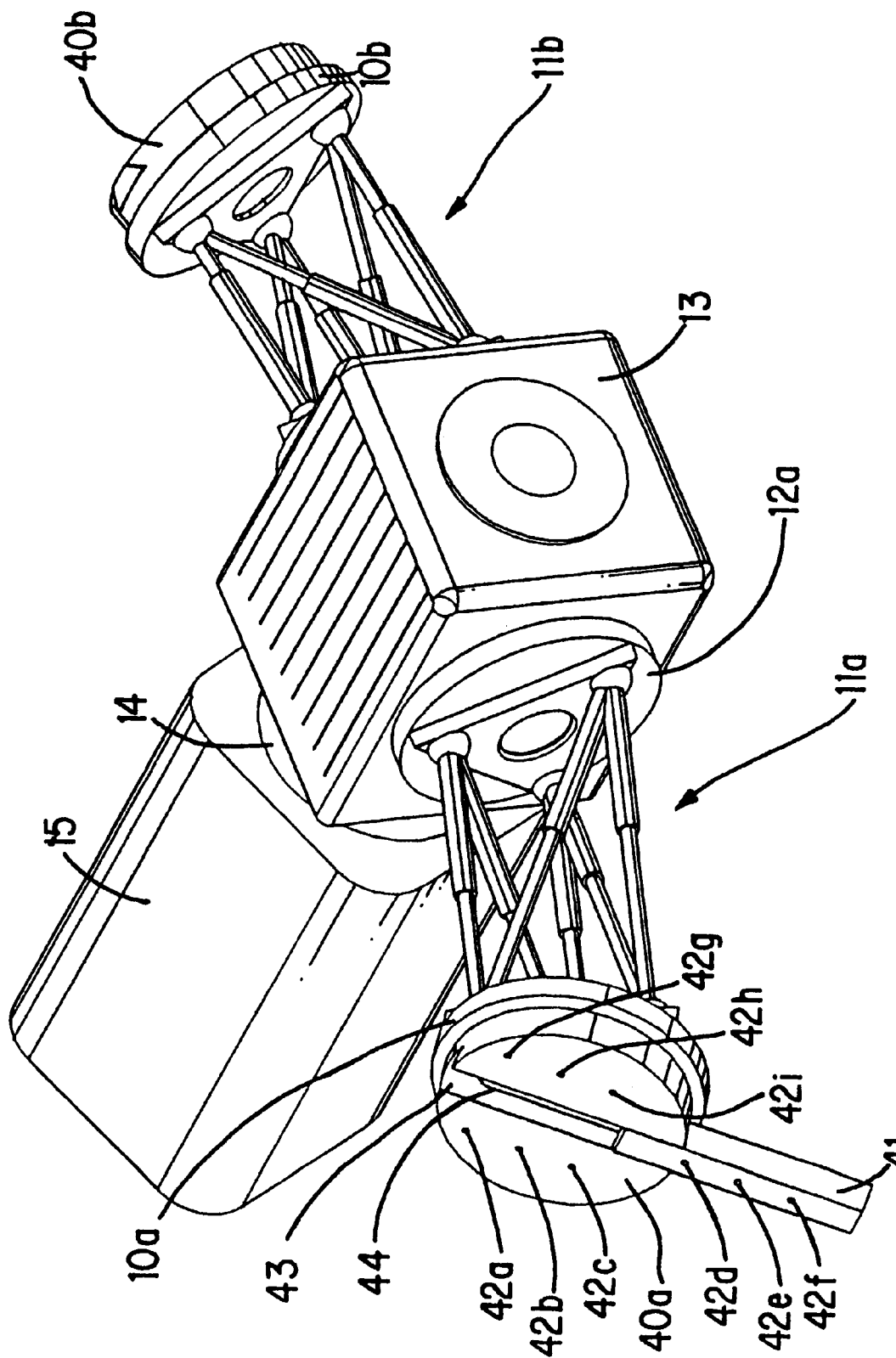
FIG. 4 is a close-up isometric view of the Hexapod with a sliding tongue-type gripper that can be used to reach down into a cassette of wafers and use a vacuum to extract one of the wafers.

FIG. 4 shows in greater detail one embodiment of identical tool plates 40a and 40b which can be used for handling wafers. Tool plate 40a has an extendible tongue 41 that can dip down into a cassette of wafers to vacuum grip the backside of a wafer with vacuum ports 42d, 42e and 42f. Of course the exact number of ports used and their configuration will vary with the size of the wafer and is known to those skilled in the art of wafer handling.

Tongue 41 is shown sliding in a dovetail 43. FIG. 4 shows tongue 41 extended. Dovetail joint 43 allows the surface of tongue 41 to be slightly raised above the surface of the tool plate 40a. Electromagnetic actuator 44, such as a solenoid, presses tongue 41 from its back side to raise it above the surface of tool plate 40a. In a raised position, a wafer held on tongue 41 can be moved without scraping across the surface of tool plate 40a. Dovetail joint 43 may be an air bearing dovetail.

When a wafer has been grabbed, tongue 41 slides back into tool plate 40a. Once tongue 41 is retracted, electromagnetic actuator 44 is reversed to bring the surface of tongue 41 flush with the surface of tool plate 40a. The other vacuum ports 42a, 42b, 42c, 42g, 42h, and 42i can be used to also vacuum hold the wafer in place in the retracted position.

When the wafer or tray of chips is presented to the test head 2, final angular alignment between the surface of the wafer and the test head can be accomplished by the use of capacitance probes that read the distance at three points between the test head and the wafer surface. When hexapods are used for positioning mechanisms 11a and 11b, they can then do a fine servo adjustment of pitch and roll.

The fundamental operating mode for either wafer test, or chip test is thus to move the entire load of parts or the wafer in a step-wise fashion which therefore minimizes the amount of mass in motion (inertia). The use of the hexapods further enhances the efficiency of the system, because the hexapod offers the greatest accuracy with the least inertia for precision motion of a platform through a large range of motion. This allows a single mechanism to efficiently pick up, test, and drop off the parts to be tested. Other systems require a series of mechanisms to accomplish these tasks, which reduces speed and reliability.

Figure 5:
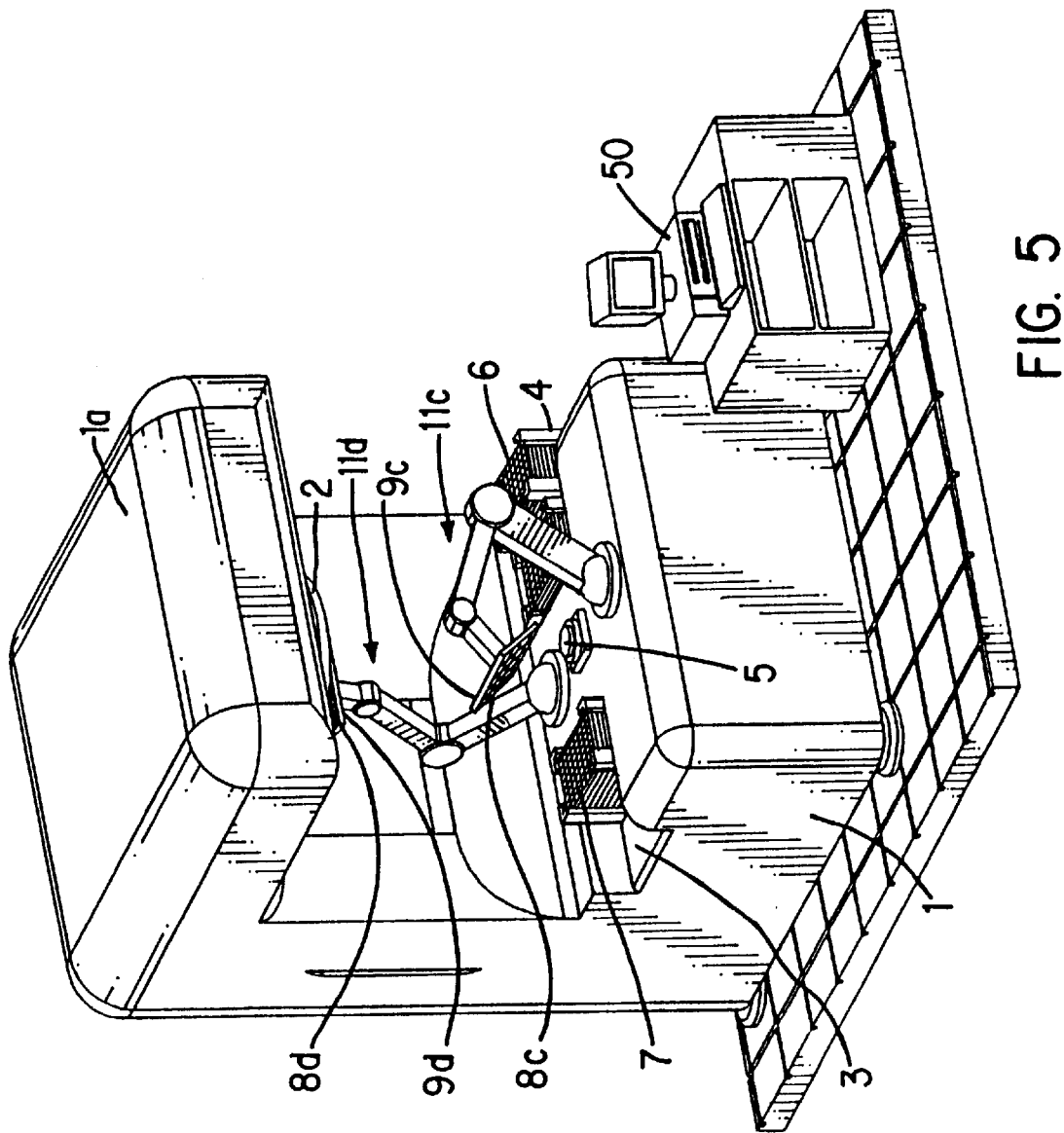
FIG. 5 is an isometric view of a system that uses two six degree of freedom precision robots to pick up and visually map the location of chips in a tray, and test chips in a tray respectively.

Even though the hexapods provide the fastest most accurate method for part transfer, one can also use conventional robot systems. These robot systems could be configured on either side of a rotary axis, like the hexapods, or they can be configured on the machine independently as shown in FIG. 5. In this configuration, the machine 1 still has an upper part 1a and the test head 2 and the loading zone 3 with input trays 7 and the unloading zone 4 with output trays 6. It also still has camera 5 to map the positions of the chips once they are picked up. However, in the embodiment of FIG. 5 the positioning mechanisms are robots 11c and 11d which are shown here as six degree of freedom articulated robots. The robots hold trays 8c and 8d respectively by means of vacuum tool plates 9c and 9d similar to tool plates 9a and 9b used by the hexapods in FIG. 1.

By integrating the function of part handling and testing with multiple degree-of-freedom precision devices work station 2 can be made stationary. Having a stationary work station is particularly beneficial in the case of automatic test equipment for semiconductor components. Such test equipment often has the test station connected to a main frame through a giant cable bundle. The cable is generally expensive and is so heavy that it can interfere with precise positioning of the test station with respect to the part to be tested. Eliminating the cable also allows the computer test circuitry to be placed close to the test station, which in turn increases the speed and reliability at which testing can be done.

Figure 7:
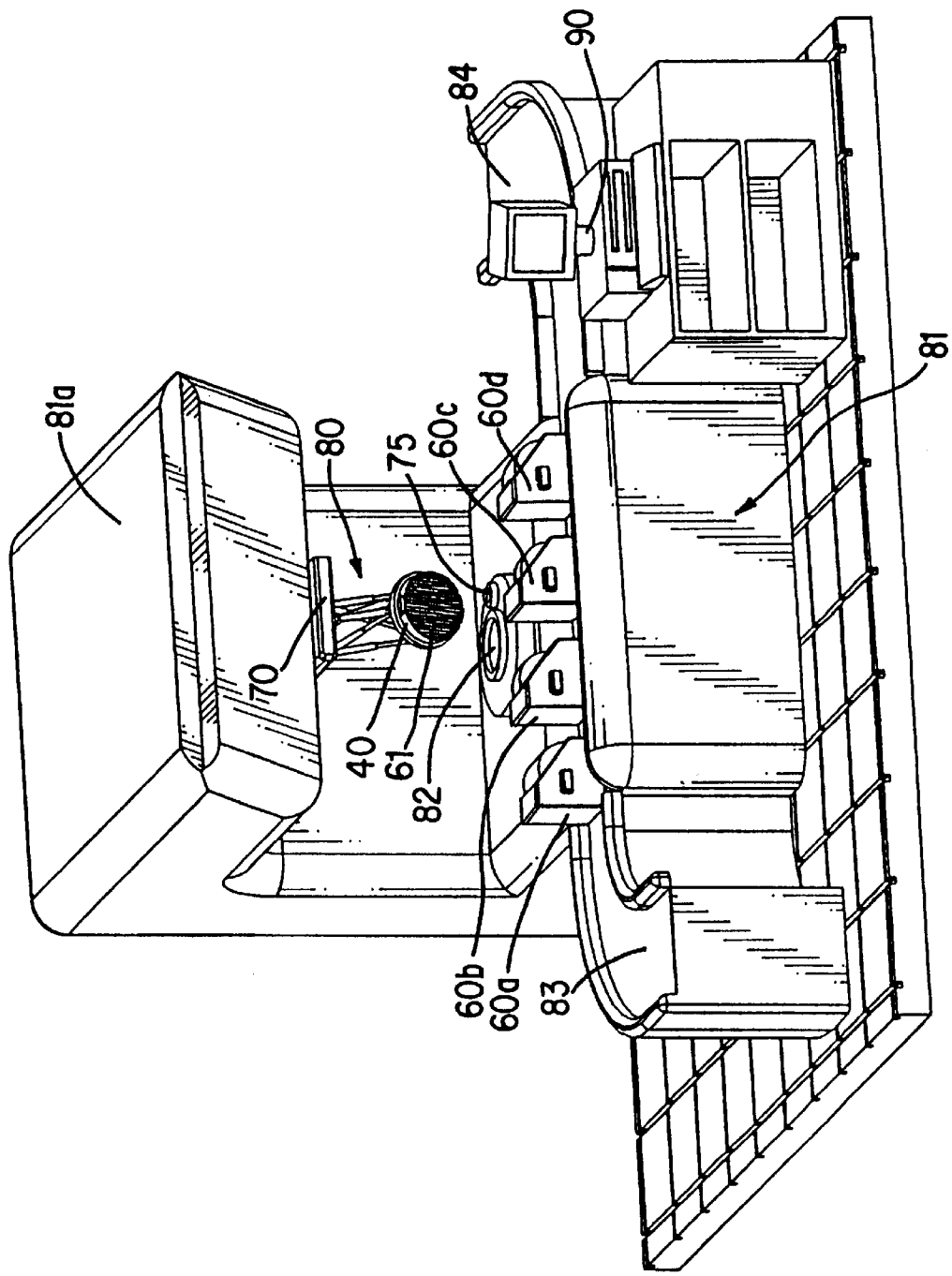
FIG. 7 is an isometric view of system that uses one Hexapod to pick up a wafer from a cassette, move it over a camera and test area, and then place the wafer back into a cassette.

The use of two positioning mechanisms, such as the hexapods, in this coordinated manner provides a unique way to yield the greatest of wafer or chip processing speeds. However, in some applications, where the test time is very long, the wafer exchange time is not as critical, and it can be more economical to utilize a design with only one positioning mechanism. Such an application is illustrated in FIG. 7 where the automated system 81 is controlled by a computer 90. It is contemplated that the automated system 81 is an automatic test system.

FIG. 7 is an isometric view of automated system 81 with an upper structure 81a that uses one Hexapod 80 attached to upper structure 81a via base 70 to pick up a wafer 61 with tongue-type tool plate 40 (described in greater detail in FIG. 4) from a cassette 60c. It then moves it over a camera 75 and work station 82. When the testing of wafer 61 is complete, hexapod 80 places it back into the cassette 60c (or it could place it into a different cassette such as 60d, so in effect their would always be a buffer cassette in the machine). Cassettes 60a and 60b have come into the machine for example on input conveyor 83 and are waiting as a buffer. The wafers in cassette 60d (if it is not being used as an output buffer) have been tested and are on their way out on conveyor 84.

Note that the invention might also be used in other semiconductor processing apparatus. For example, it might be used in a photolithography system at the work station. Such a device requires extremely precise positioning control. The required precision might be provided using laser interferometer mirrors attached to the end of the Hexapod system 40 just below wafer 61, as described in conjunction with FIG. 15, below. The positioning mechanism would then be used as a wafer stepper. Wafer steppers also have need of six degree of freedom position control, and the disclosed invention would reduce mechanical complexity. Very significantly, the invention would eliminate the current problems associated with wafer hand-off between the precision motion stage and a robot that takes wafers out of the cassette and replaces them.

Figure 8:
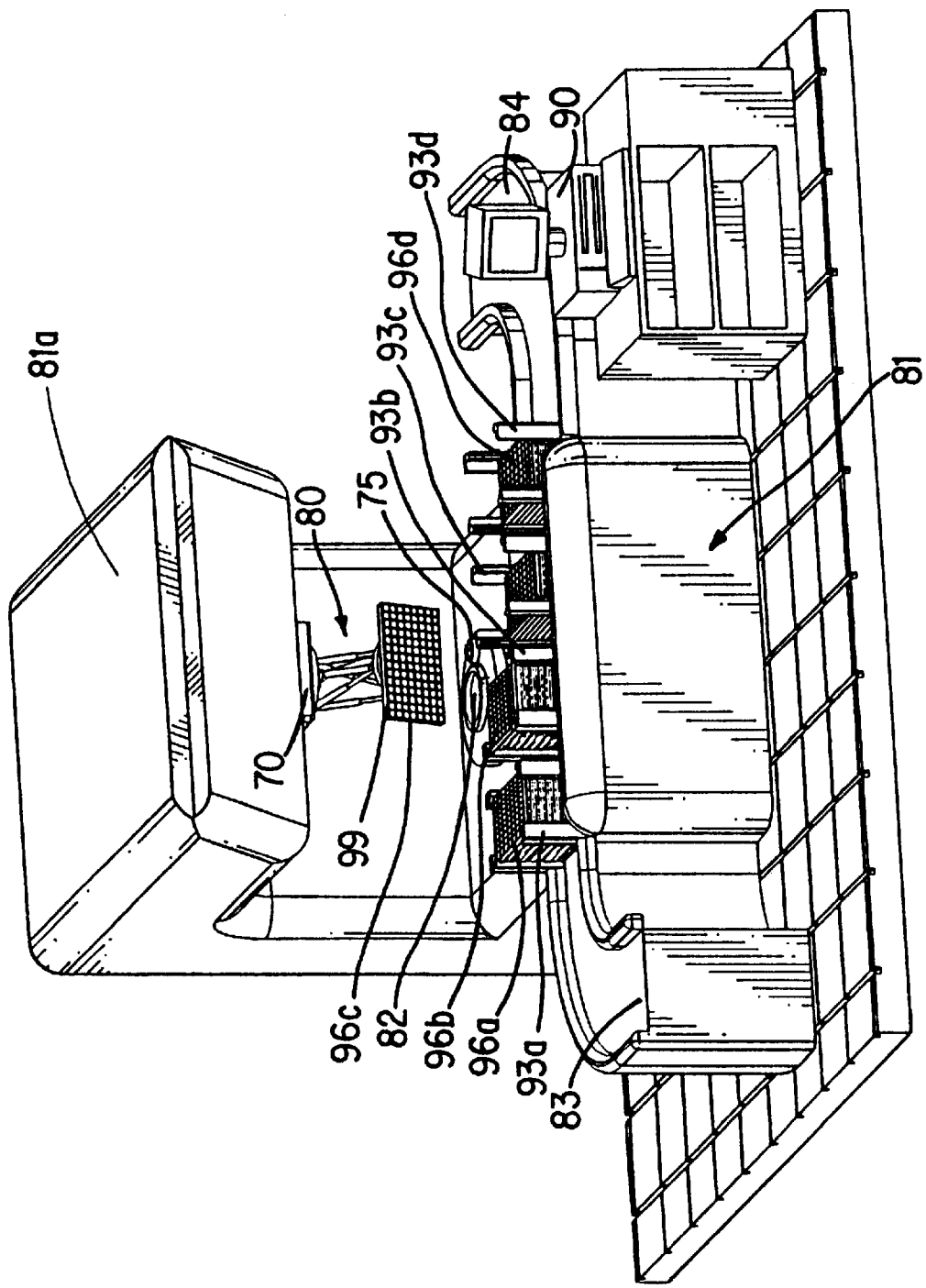
FIG. 8 is an isometric view of a system that uses one Hexapod to pick up a tray of chips and hold them over a camera and a test socket, and then replace the chips into an outgoing receiver.

In a similar manner, FIG. 8 shows a system for testing packaged semiconductor chips. In this figure, magazines 93a, 93b, 93c, and 93d can also be used to hold trays of chips such as 96a, 96b, and 96c to be tested in automated system 81 with one hexapod positioning mechanism 80 attached via base 70. Magazine 93d is an output buffer, e.g., tray 96d has been tested. When full, magazine 93d will be replaced by magazine 93c and leaves the machine either by pick up from a person or automated guided vehicle, or conveyor 84. The trays come into the machine on conveyor 83 and leave on conveyor 84. The hexapod positioning mechanism 80 picks up a tray of wafers 96c from tray holder 93c with vacuum tool plate 99, similar to tool plate 9a shown in FIG. 2. It then moves the tray of chips into a horizontal position, such that while the contacts on one chip are being optically mapped by vision system 75, a previously mapped chip is being tested at work station 82. In this manner, the entire tray of chips is sequentially tested. The tray is then placed into output magazine 93d.

Figure 9:
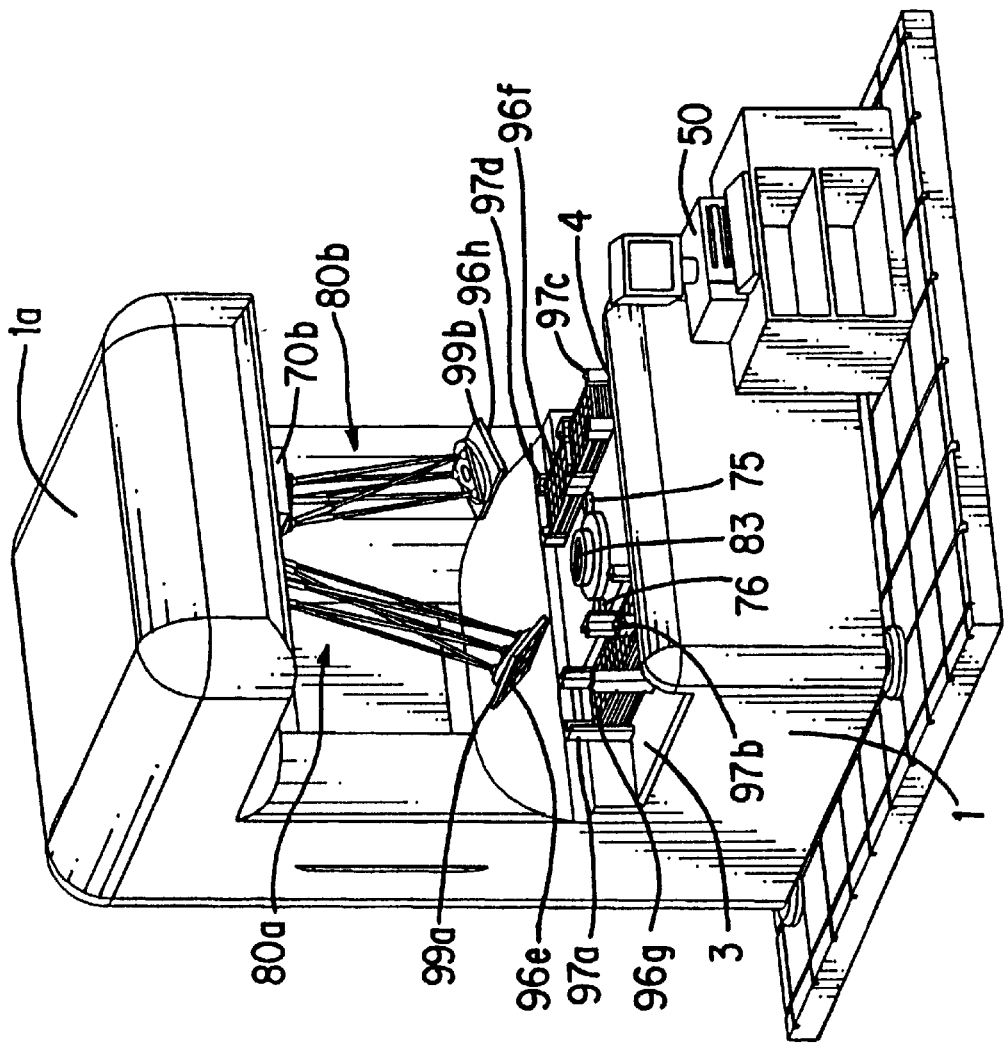
FIG. 9 is an isometric view of a system that uses two Hexapods mounted to a fixed surface to pick up an array of chips, hold them over a camera for position mapping, test them in a test socket, and then place the chips into an outgoing receiver.

In still another possible representation of the invention using coordinated motion of two hexapod positioning mechanisms, FIG. 9 shows a machine 1 controlled by computer 50 that again has two hexapod positioning mechanisms 80a and 80b connected for example by base plates 70a and 70b to the top of the machine 1a. The hexapod positioning mechanisms 80a and 80b have tool plates 99a and 99b like tool plates 9a in FIG. 6 when the machine is set up for holding trays of integrated circuits (chips) or tool plate 40b in FIG. 4 for holding silicon wafers. In this case, the hexapod positioning mechanisms 80a and 80b have used their tool plates 99a and 99b to pick up trays 96e and 96h, respectively, of chips from tray holding stacks 97a and 97d, respectively. The position of the chips on the end effectors 99a and 99b will be mapped using cameras 76 and 75, respectively. In general, hexapod positioning mechanisms 80a and 80b are operated out of phase: positioning mechanism 80a will be presenting its load of chips 96e to work site 82 while positioning mechanism 80b will be placing its tested load of chips onto the output stack 97c which is located in unloading zone 4. After positioning mechanism 80b places its tested load of chips down, and positioning mechanism 80a is still presenting its load of chips to work site 82, positioning mechanism 80b goes to input tray stack 97d and gets the next tray 96f. Positioning mechanism 80b then passes these chips over the vision system 75 to map their locations. When positioning mechanism 80a is done presenting its load to work site 82, positioning mechanism 80b is ready to move in right away and present its load of chips to work site 82. Meanwhile, positioning mechanism 80a has gone to put its tested set of chips down on output stack 97b in unloading zone 4. Hexapod 80a will then go and get another set of chips from a tray such as 96g. The use of two Hexapods makes the machine much faster. In addition, should one hexapod become inoperative, the machine could still be operated at a reduced rate using the other operating hexapod.

It should be noted that in this configuration, it would be straightforward to replace the tray stacks 97a, 97b, 97c, and 97d with wafer cassettes, and the end effectors 99a and 99b with wafer holding end effectors such as 40a and 40b in FIG. 4. Thus the test unit referred to as a handler in the industry (a machine for testing chips) could be readily converted over to a prober (a machine for testing die sites on wafers). This makes the manufacture and use of this machine extremely efficient and modular. This will greatly reduce cost and floor space requirements, as well as increase speed and quality.

The invention has primarily been described above as being used in conjunction with testing finished wafers or chips to be tested. However, a similar concept of mounting a hexapod positioning mechanism in a novel way to facilitate semiconductor component processing can also be used for other processing steps.

Figure 10:
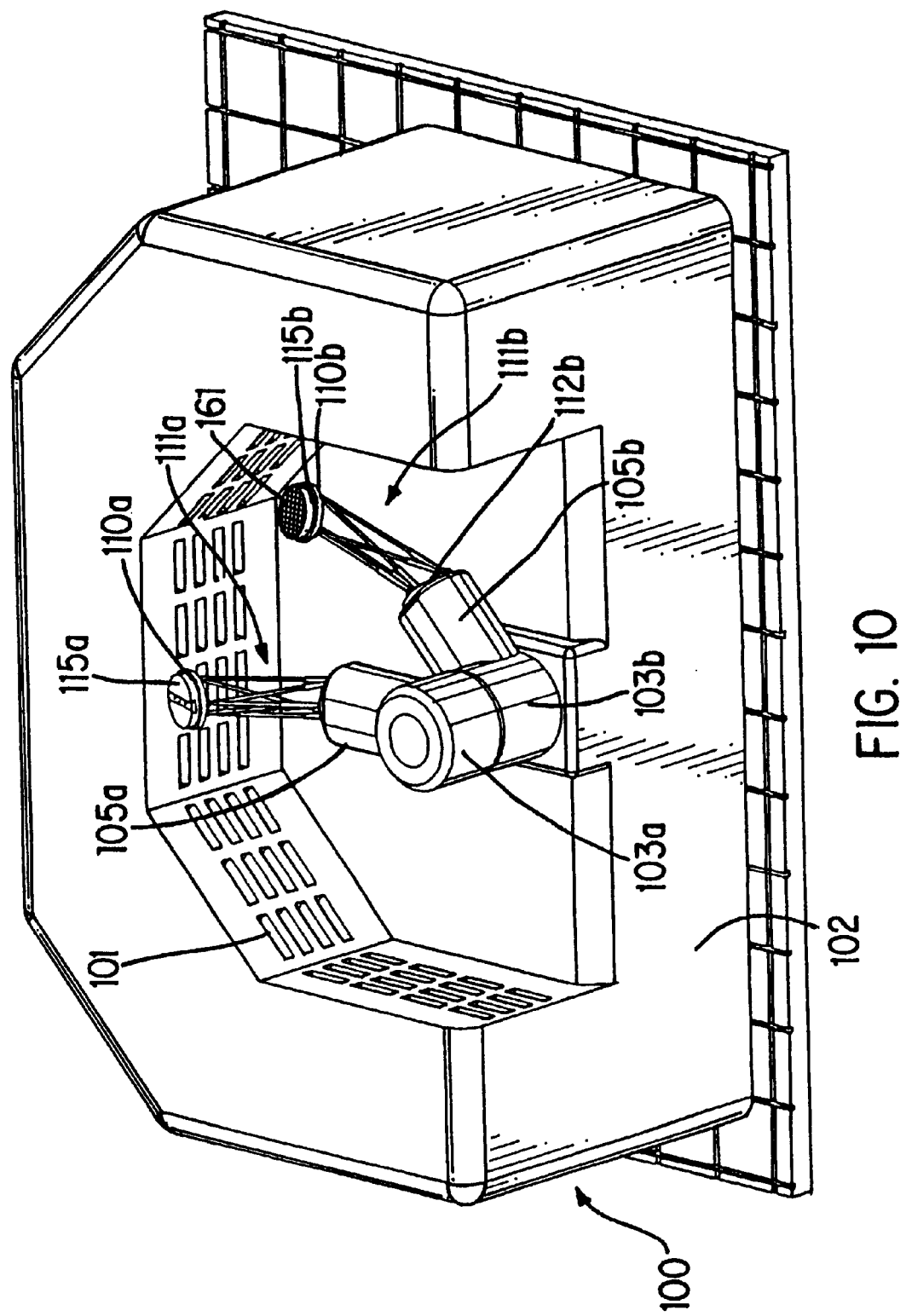
FIG. 10 is an isometric view of a processing system that uses one or more Hexapods mounted on rotary axes to service many bays in a wafer processing station.

An alternative application of the invention is shown, for example, in FIG. 10, which is an isometric view of a processing system 100 that uses hexapod positioning mechanisms 111a and 111b mounted on rotary mount 103a and 103b with arms 105a and 105b respectively. The processing system 100 contains a large number of processing modules 101, such as for dispensing photoresist or baking the wafers. Here tongue-type tool plates 115a and 115b are used, which are similar to tool plate 40a shown in FIG. 4.

The rotary mounts 103a and 103b provide course motion for the hexapod positioning mechanisms 111a and 111b to bring them near a group of the processing modules 101. Once near a group, the hexapod positioning mechanism services that group to insert and remove the wafers from those processing modules. As was described above, fine motions of the hexapod are made by adjusting the lengths of the struts which make up the hexapod. The positioning mechanism then moves to a new area and similarly services the processing modules in that area.

Figure 11:
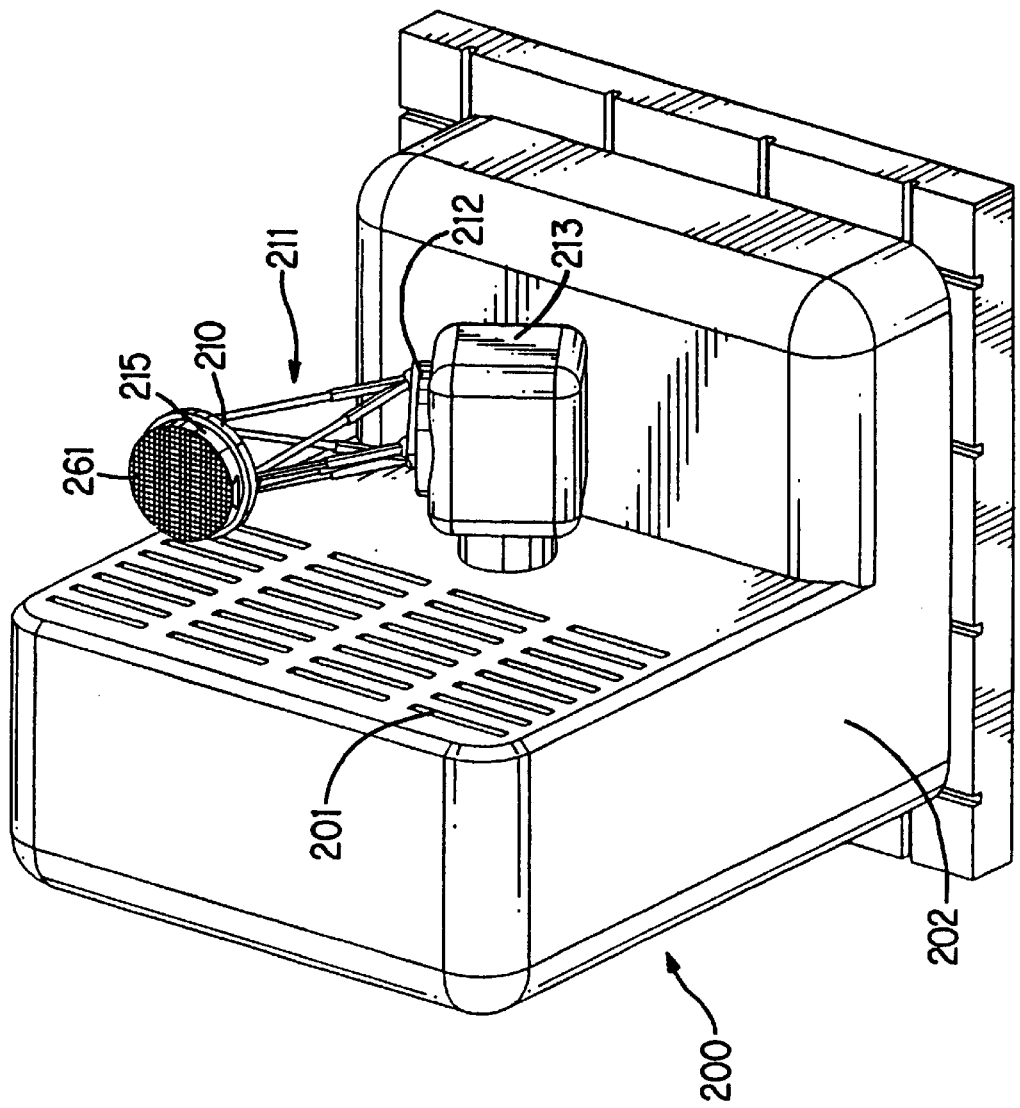
FIG. 11 is an isometric view showing another embodiment of the use of a rotary axis to allow a Hexapod to lean over to gain access to an entire array of processing modules.

A similar, but smaller scale, version of this unique design concept is shown in FIG. 11. Here a processing system 200 has a large number of process modules such as 201. A hexapod positioning mechanism 211 is mounted to service these modules. In this case hexapod positioning mechanism 211 is attached to a rotary mount 213. Rotary mount 213 allows hexapod positioning mechanism 211 to easily reach the outer lower and upper outer process modules 201. Once again, the hexapod positioning mechanism has a top plate 210 to which a tool plate 215, such as the tongue-type gripper 40a shown in FIG. 4, is attached to hold the wafer 261.

Figure 12:
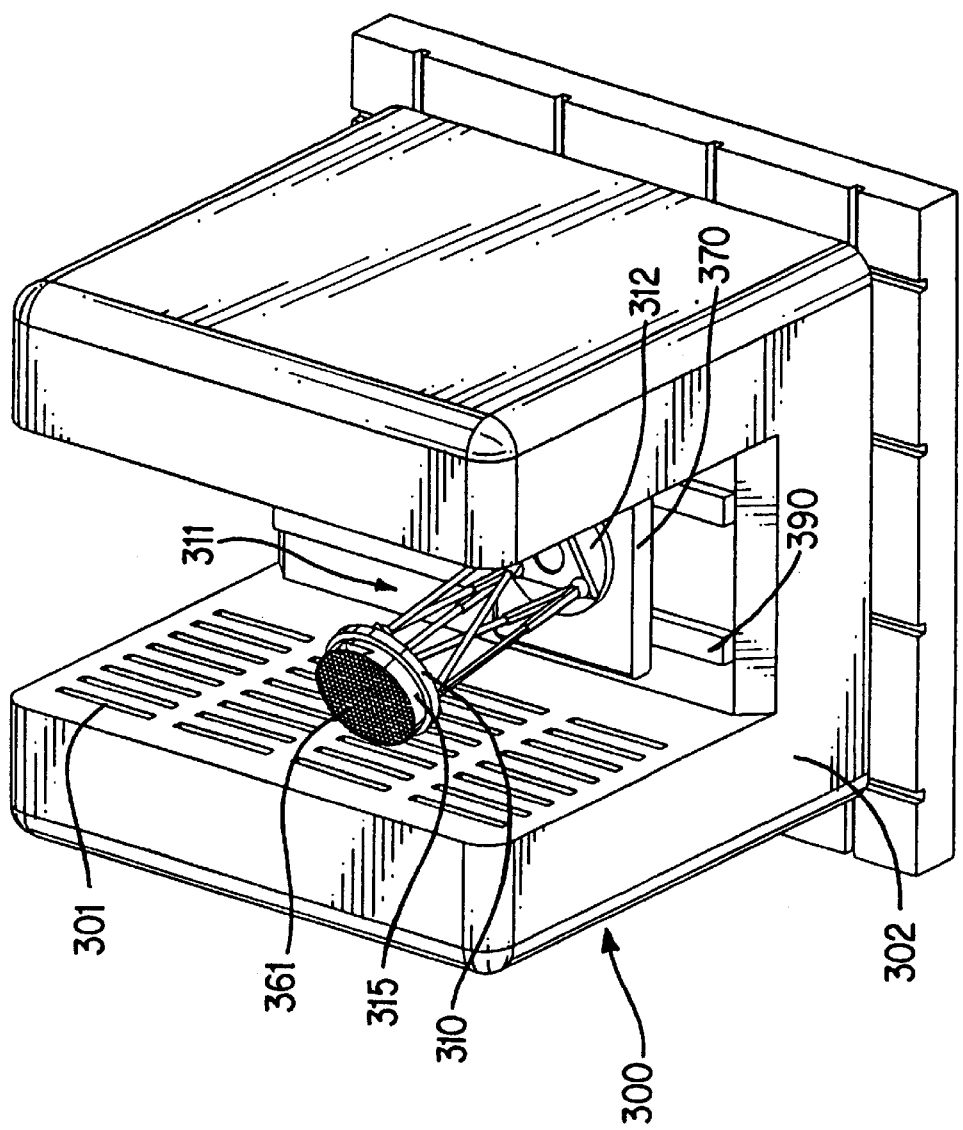
FIG. 12 is an isometric view showing the use of a linear axis to move the Hexapod to give it greater range of motion and hence access to more modules to deliver wafers.

As shown in FIG. 12, for longer travel systems 300 that may contain more or larger processing modules 301, it may be desirable to attach the base 312 of hexapod positioning mechanism 311 to a linearly moving stage 370 that rides on linear bearings 390. Note that a rotary axis, similar to the one used in FIG. 11, may also be placed between hexapod positioning mechanism 311 and the linearly moving stage to give even greater flexibility. In the system of FIG. 12, the top 310 of the Hexapod 311 has attached to it a tool plate 315, such as the tongue-type gripper shown in FIG. 4, to hold the wafer 361.

Figure 13:
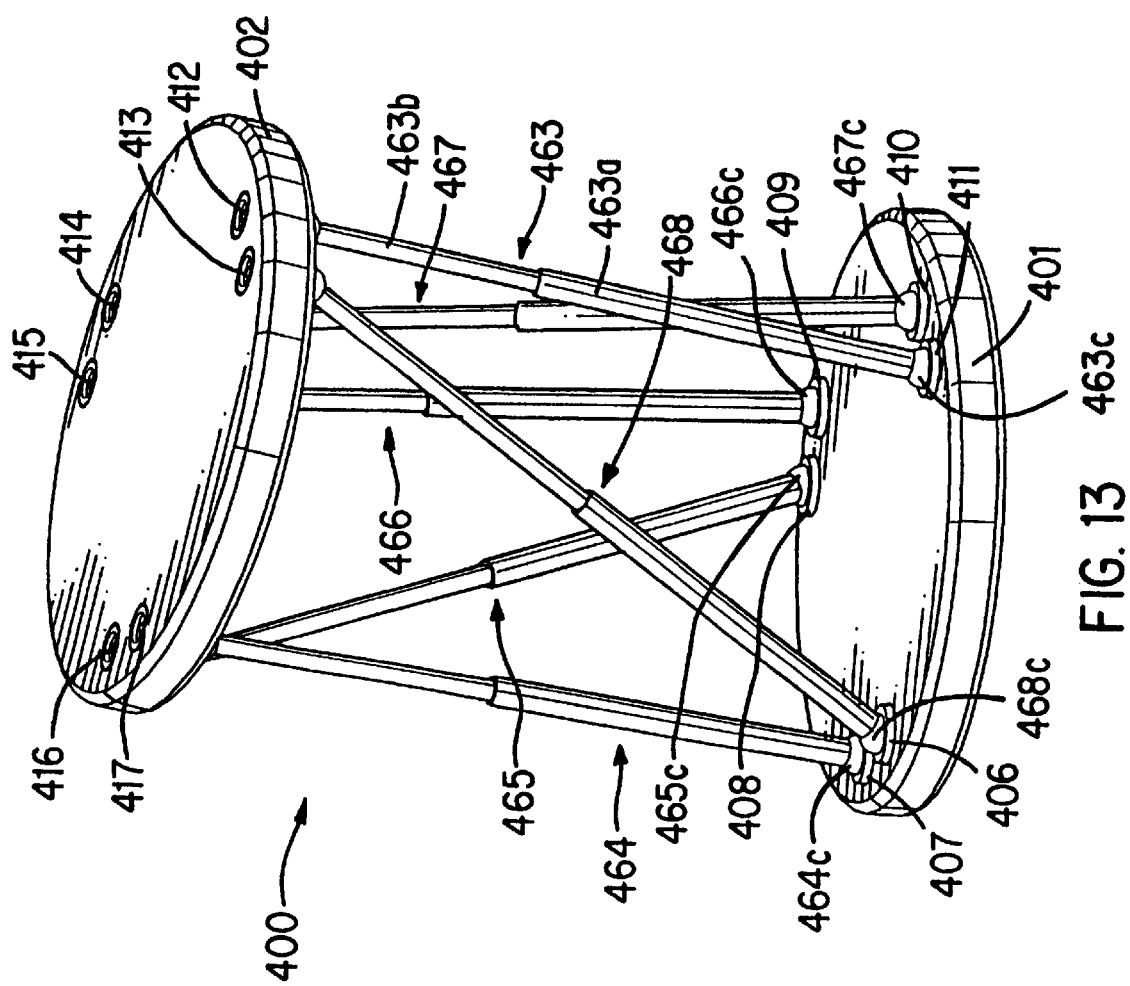
FIG. 13 is an isometric view of a six-point attachment design for a Hexapod where the struts are made from linear tubular motors with spherical ends.

Certain of the above described embodiments use a hexapod for a positioning mechanism. FIG. 13 shows hexapod 400 which is suitable for use as a positioning mechanism according to the invention. Six struts 463, 464, 465, 466, 467 and 468 extend between plates 401 and 402, which are identical.

Taking strut 463 as illustrative, the strut has an upper moving rod 463b and a lower stator tube 463a. Upper moving rod 463b slides inside lower stator tube 463a, allowing the length of strut 463 to be adjusted.

Lower stator tube 463a terminates in a sphere 463c. Lower stator tube could be machined, such as with a lathe, from a single piece such that sphere 463c is an integral part of lower stator tube 463a. Alternatively, sphere 463c could be manufactured separately and then attached to lower stator tube 463a. Upper moving rod 463b likewise terminates in a sphere, not visible in FIG. 13.

Sphere 463c is press fit into a modular spherical seat 411 in plate 401. This arrangement forms a ball and socket type joint, allowing the strut to pivot freely about its point of attachment to plate 401. The sphere 463d (FIG. 14) at the end of upper moving rod 463b is likewise press fit into a hole in plate 402, allowing pivoting motion about plate 402. Sphere 463d need not be the same size as sphere 463c. All other struts 464 ... 468 are similarly constructed, allowing them all to be extended or retracted and to pivot about plates 401 and 402.

In use, plate 401 is fixed, such as to base 13. By extending and retracting the struts 463 ... 468, the position of plate 402 can be moved with six degrees of freedom. A tool plate, such as tool plate 9a is attached to plate 402. For most semiconductor processing applications, the total weight of plate 402 and tool plate 9a is on the order of 10 pounds. It will be appreciated that fast and precise control of such a small weight can be readily achieved.

It is known that the control algorithms for a hexapod are simplified if the struts of the hexapod converge to just three points on plate 401 and three points on plate 402. FIG. 13 shows, for example, that struts 463 and 467 are mounted close together on plate 401. They do not, however, converge to a single point. An alternative structure could be used in which struts converge to a point. For example, patent WO 91/17313 by Geodetic Machines Ltd., which is hereby incorporated by reference, describes a hexapod which uses one split ball in place of two spheres. One strut is attached to each side of the split ball. FIG. 2 illustrates the use of such a hexapod. The alternative structure provides the advantage of reduced control complexity, but higher manufacturing cost. The higher control complexity of the embodiment of FIG. 13 can be readily provided by microprocessor-based servocontrollers, and if needed to a very high degree of precision such as described in U.S. Pat. No. 4,878,002, which is hereby incorporated by reference.

Figure 14:
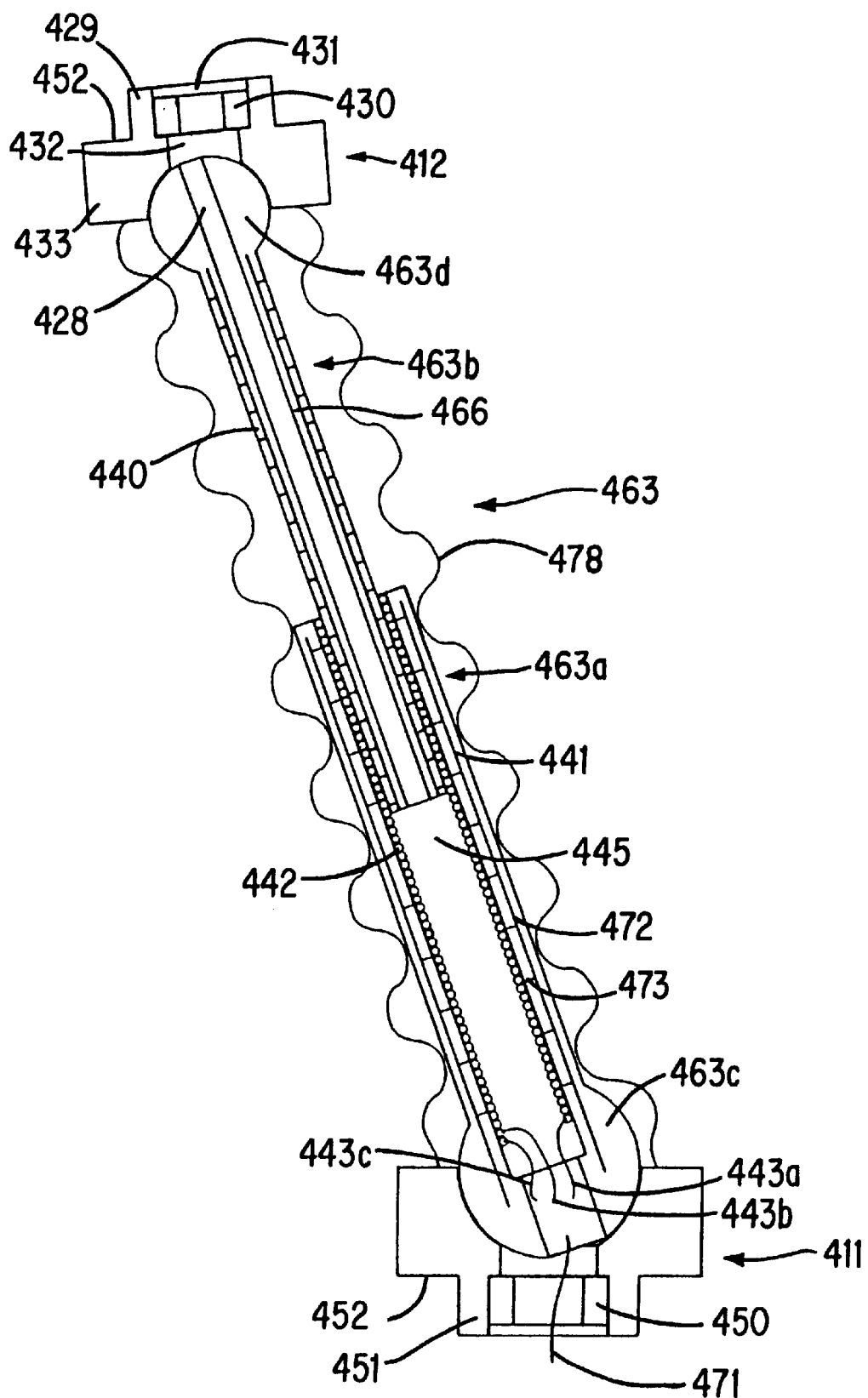
FIG. 14 is a section view of one of the tubular linear motors used as a strut in the Hexapod of FIG. 13.

FIG. 14 shows in greater detail strut 463, taken as representative of all six struts 463 ... 468. Upper moving rod 463b has an inner structural tubular core 466 encased with a series of tubular magnets 440 along its length. Lower stator strut 463a has an outer structural tube 441 that is lined with three phase coils 442 with leads 443a, 443b, and 443c that control the current in the coils.

Three phase coils 442 are coated with a smooth bearing-grade epoxy to yield a low friction sliding contact surface 445. The same epoxy can also serve as a replicant to hold three phase coils 442 in place. In instances where very high precision is required, surface 445 can be made into an externally pressurized fluid bearing, as is known to those skilled in the art of aerostatic bearing design. If a fluid bearing is used, a mechanism to contain the fluid is required. For example, bellows 478 connected between modular spherical seats 411 and 412 might be used.

A mechanism to supply pressurized fluid is also required for an externally pressurized fluid bearing. Pressurized fluid is provided through high pressure fluid hose. The fluid is distributed through high pressure fluid distribution line 472 and feeding lines 473. High pressure fluid feeding line and restrictor might also be required.

Use of a fluid bearing has the advantage of also providing cooling to coils 442. However, an air bearing surface might also be used.

Strut 463 therefore acts as a linear motor with upper moving rod 463b sliding relative to lower stator tube 463a. By appropriate control of coil in three phase coils 442, strut 463 expands or contracts in a manner known to those skilled in the art of linear electric motor design and control, or using more advanced algorithms such as described in U.S. Pat. No. 5,023,528, which is hereby incorporated by reference.

Position feedback could be obtained with the inclusion of a linear encoder coaxial with the strut. Either an optical or magnetic encoder could be used. Alternatively, position feedback can be provided by sensing the field variations in the windings, as is known to those skilled in the art of dc brushless servomotor design.

Sphere 463c is seated in modular spherical seat 411 which has a magnet 450 that preloads and holds sphere 463c in place, while allowing it to move as a ball-and-socket joint. Modular spherical seat 411 has a post 451 that is precision ground and a depth-control edge 452 also ground at the same time as the spherical seat for sphere 463c. This is similar to the well known ball-bar sphere-in-socket retention system developed by James Bryan at Lawrence Livermore National Labbs. With these three critical features precision ground at the same time, and after being pressed into precision holes in the base plate 401, a very high degree of mechanical accuracy can be obtained for the Hexapod 400. Similarly, a top seat 412 has a magnet 430 in its base that is used to hold and preload spherical end 463d into the seat. Again there is a precision post 429 and a precision step 452 that allow the set 412 to be pressed into plate 402 with great X,Y, and Z location accuracy.

Figure 15:
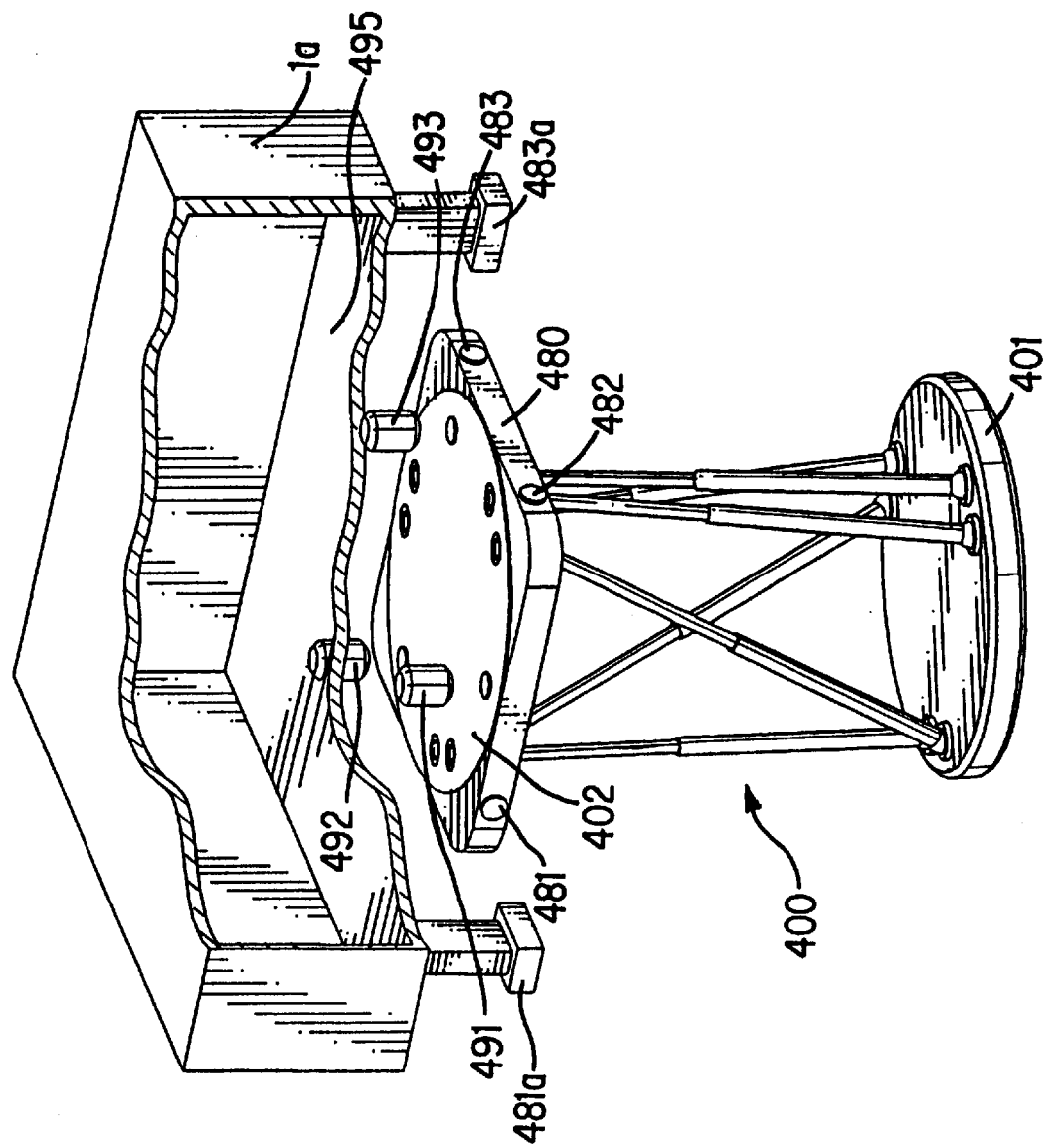
FIG. 15 is an isometric view of a hexapod positioning mechanism with mirrors for interferometers and a flat top plate against which distance measuring devices can determine the position of the plate.

Turning now to FIG. 15, a position sensing arrangement for use in the invention is shown. Structure 480 is mounted to top platform 402 of hexapod 400. Three orthogonal mirrors 481, 482 and 483 are mounted on structure 480. Laser interferometers 481a and 483a are mounted on the bottom surface 495 of upper portion 1A. The laser interferometers 481a and 483a direct a beam of laser light towards mirrors 481 and 483, respectively. A third laser interferometer 482a directing a beam at mirror 482 is not visible. Laser interferometers 481a, 482a and 483a can accurately determine the position of structure 480 relative to three axes— which are sometimes called X, Y and Yaw.

Distance sensors 491, 492 and 493 are also mounted on bottom surface 495. Distance sensors 491, 492 and 493 are, for example, capacitive probes. Distance sensors are mounted so as to not be colinear, allowing them to determine the position of structure 480 also along three axes. The combined measurements with distane probes 491, 492 and 493 and laser interferometers 481a, 482a and 483a is to accurately measure the position of structure 480 in six coordinates relative to upper portion 1a, and therefore work station 2.

The position sensors shown in FIG. 15 are useful where a high degree of positioning accuracy is required. For example, they might be used in conjunction with a photolithographic projection system Having described embodiments of the invention, numerous alternative embodiments or variations might be made. For example, FIG. 1 shows only two tray magazines 20b in unloading zone 4. Any number of tray magazines might be used in order to accommodate sorting of testing parts into more than two categories. Further tray magazines could be placed beside tray magazines 20b. To allow positioning mechanisms 11a and 11b to reach more tray magazines, each positioning mechanism 11a and 11b might be mounted to base 13 with a linear mount similar to that shown in FIG. 12.

Also, it was described in conjunction with FIG. 1 that once a tray such as 8a is picked up by one of the positioning mechanisms the orientation of the tray is determined from images made by camera 5. Alternatively, some sort of mechanical positioning means could be used. Tabs of stops could be incorporated into tool plates 9a and 9b to ensure that each tray always seats in the same position in tool plates 9a and 9b. Camera 5, and the vision system associated with it, might then be eliminated, or used less frequently.

If chips 21 fit loosely into trays 8a, determining the position of the tray relative to the tool plate might not always be adequate, regardless of whether the position of the tray is determined by camera 5 or by structures to seat the tray on the tool plate. The chips might need to be aligned with the trays. The structure of FIG. 6 can be easily operated to achieve this alignment. For example, one of the positioning mechanisms could grasp a tray in its tool plate by drawing a vacuum through all of the holes 60 (FIG. 6). With a vacuum through all of the holes, the tray would be held to the tool plate and the chips would be held in the tray. The positioning mechanism would then move the tray so that it was held at a compound angle relative to the direction of gravity, but with the tool plate facing up. In this position, the vacuum through the holes 60 aligned with the chips would then be released. The vacuum through the holes aligned with the tray would be maintained. In this configuration, the tray would still be held to the tool plate but the chips would be free to move within the recesses of the tray. Because the tray is held at a compound angle, gravity will pull all of the chips into the same corner of their respective recesses in the tray. If necessary, the positioning mechanism can be vibrated to aid in moving the chips. Once the chips have slid into the desired position, the vacuum through all of the holes 60 will then be reestablished, fixing the position of the chips. The position of the chips with respect to the tray will then be determined. Such a procedure might be particularly important, for example, if work site 2 can operate on multiple chips simultaneously. The pitch between all of the chips would have to be constant, which can be achieved if the spacing between the recesses in the tray are constant.

As an example of other variations, various operations beyond those described herein might be performed by machine 1. For example, it is sometimes desirable to test chips at an elevated temperature. If necessary, loading zone could be enclosed by a heating box which would raise the temperature of the chips waiting to be tested. Likewise, work station 2 could be enclosed in a heating box. As another alternative, tools 9a and 9b might be equipped with resistive heating elements to heat the semiconductor components.

As another variation, the invention might be used for handling other types of objects. For example, it might be used as part of an inspection system for LCD flat panel displays. In that instance, because each LCD flat panel display is much larger than a semiconductor die, each positioning mechanism might handle a single flat panel at a time.

Therefore, the invention should be limited only by the spirit and scope of the appended claims.

What is claimed is:

1. Apparatus for processing a plurality of semiconductor devices held in a tray, comprising:
   a) a base;
   b) an input zone in the base adapted to hold the tray;
   c) a work station, coupled to the base, at which semiconductor devices are processed;
   d) a positioning mechanism having a distal portion and a coupling between the base and the distal portion, the coupling being movable with a range of motion encompassing at least the input zone and the work station and being further movable with degrees of freedom allowing the distal portion to be tilted relative to the input zone; and
   e) a tray pickup, connected to the distal portion of the positioning mechanism, the tray pickup including means for selectively releasing semiconductor devices without releasing the tray.

2. The apparatus of claim 1 additionally comprising an output zone and the rage of motion of the coupling encompasses the output zone.

3. The apparatus of claim 1 wherein the tray pickup comprises a vacuum drawn through a surface having openings therein.

4. The apparatus of claim 1 wherein the coupling of the positioning mechanism comprises:
   a) a platform disposed at the distal portion of the positioning mechanism;
   b) a plurality of struts, each having a first end and a second end with the first end of each strut rotatably mounted to the platform and the second end of the strut being rotatably coupled to the base, the length of each of the struts being independently adjustable.

5. The apparatus of claim 1 additionally comprising:
   a) an elongated member attached to and extending from the base; and
   b) a movable mounting coupling the positioning mechanism to the elongated member, thereby movably coupling the positioning mechanism to the base.

6. The apparatus of claim 1 additionally comprising a linear bearing movably coupling the positioning mechanism to the base.

7. The apparatus of claim 5 wherein the movable mounting is a rotating bearing.

8. The apparatus of claim 1 wherein the positioning mechanism additionally comprises:
   a) a second positioning member;
   b) a mounting structure having at least a first side and a second side; and
   c) a rotary mounting connecting the mounting structure to the base, wherein the positioning member is mounted to the first side and the second positioning mechanism is mounted to the second side.

9. The apparatus of claim 3 wherein the tray pickup with a vacuum drawn through a surface having openings therein comprises a surface with a plurality of openings therein with mechanisms to independently control the vacuum drawn though selected ones of the plurality of openings.

10. The apparatus of claim 1 additionally comprising a camera mounted in the base and means for controlling the apparatus to pick up from the input tray of semiconductor components, move them near the camera, process the image from the camera to determine the relative positions of the semiconductor components and present the semiconductor components to the work station.

11. Apparatus for processing semiconductor devices in which the semiconductor components are moved from an input zone to a work station for processing, comprising:
    a) a base structure;
    b) a work station;
    c) a first structure comprising a first plate and a second plate and a plurality of extendible struts coupling the first plate to the second plate, the first plate being coupled to the base structure; and
    d) first means, attached to the second plate, for grasping multiple semiconductor devices in an array; and
    e) means for controlling the first structure to move the array of semiconductor devices in a step-wise fashion to sequentially present semiconductor devices in the array to the work station for processing.

12. The apparatus of claim 11 wherein the means for grasping comprises a vacuum plate.

13. The apparatus of claim 11 additionally comprising a rotary bearing and wherein the first plate is coupled to the base structure through the rotary bearing.

14. The apparatus of claim 11 additionally comprising a linear bearing and the first plate is coupled to the base structure through the linear bearing.

15. The apparatus of claim 11 wherein the means for grasping comprises means for grasping either a tray of semiconductor components or a semiconductor wafer.

16. The apparatus of claim 15 wherein the means for grasping comprises a vacuum plate.

17. The apparatus of claim 11 additionally comprising:
    a) a second structure, comprising a first plate and a second plate and a plurality of extendible struts coupling the first plate to the second plate coupled to the base; and
    b) second means for grasping semiconductor devices attached to the second plate of the second structure.

18. The apparatus of claim 17 wherein the first structure and the second structure are rotatably coupled to the base structure.

19. The apparatus of claim 18 additionally comprising:
    a) a post attached to the base structure and extending along a first axis;
    b) a mounting structure having at least two sides;
    c) a rotary joint coupling the mounting structure to the post, the joint rotating about the first axis; and
    d) wherein the first structure is connected to one of the sides of the mounting structure and the second structure is connected to the other of the sides of the mounting structure.

20. The apparatus of claim 11 wherein each strut of the first structure comprises:
    a) a first tube having inner walls defining a recess;
    b) a coil lining the inner inner walls of the first tube;
    c) a second tube having outer walls, the second tube inserted into the recess in the first tube; and
    d) a magnet on the outer walls of the second tube.

21. The apparatus of claim 11 wherein each strut of the first structure includes a linear electric motor.

22. The method of operating an apparatus comprising a base; an input zone in the base adapted to hold a plurality of semiconductors arranged in a tray; a work station, coupled to the base, at which semiconductor devices are processed; a positioning mechanism, coupled to the base, having a distal portion movable with respect to the base with multiple degrees of freedom, the range of motion of the distal portion encompassing at least the input zone and the work station; and a tool plate connected to the distal portion of the positioning mechanism, the tool plate comprising means for grasping a tray of semiconductor devices, comprising the steps of:

a) attaching a tool plate to the distal portion of the positioning mechanism;

b) placing a tray having semiconductor components thereon in the input zone;

c) picking up the tray with the tool plate;

d) actuating the positioning mechanism to move the tray to the work station and presenting semiconductor components on the tray to the work station;

e) actuating the positioning mechanism to move the tray to a first position away from the work station;

f) releasing a first portion of the chips in the tray;

g) actuating the positioning mechanism to move the tray to a second position away from the work station;

h) releasing a second portion of the chips in the tray.

23. The method of claim 22 wherein the step of placing a tray in the input zone comprises placing a stack of trays in the input zone.

24. The method of claim 23 wherein the tool plate comprises a plurality of vacuum ports and the steps of releasing a first portion and a second portion of the chips comprises releasing the vacuum on selected ones of the vacuum ports.

25. Apparatus for processing semiconductor wafers having a plurality of modules, each for processing a wafer, said apparatus comprising:

a) a movable base;

b) a hexapod, having a first platform and a second platform joined by a plurality of struts, the first platform being attached to the movable base; and c) a tool plate adapted to hold a semiconductor wafer attached to the second platform wherein the tool plate comprises:

i) a plate with an upper surface;

ii) means for extending from the tool plate and grasping a semiconductor wafer and retracting to draw the semiconductor wafer to the upper surface of the plate.

26. The apparatus of claim 25 wherein the movable base comprises a linear bearing allowing translation of the hexapod relative to the plurality of modules.

27. The method of operating an apparatus comprising a base; an input zone in the base adapted to hold an array of semiconductor devices; an output zone adapted to receive a plurality of semiconductors held in a tray; a work station, coupled to the base, at which semiconductor devices are processed; a positioning mechanism, coupled to the base, having a distal portion movable with respect to the base with multiple degrees of freedom, the range of motion of the distal portion encompassing at least the input zone, the work station and the output zone; and a means for grasping the tray of semiconductor devices connected to the distal portion of the positioning mechanism, comprising the steps of:

a) placing a tray of semiconductor devices in the input zone;

b) picking up the tray with the tool plate;

c) actuating the positioning mechanism to move the tray of semiconductor devices to the work station and presenting semiconductor devices within the tray sequentially to the work station;

d) actuating the positioning mechanism to move the tray of semiconductor devices to the output zone.

28. The method of operating an apparatus of claim 27 wherein the step of presenting semiconductor devices sequentially to the work station comprises moving the tray in a step-wise fashion.

29. The method of operating an apparatus of claim 27 wherein the step of presenting semiconductor devices within the tray sequentially to the work station comprises presenting groups of semiconductor devices to the work station simultaneously.

* * * * *